(12) United States Patent
Chae et al.

(10) Patent No.: US 12,193,231 B2
(45) Date of Patent: Jan. 7, 2025

(54) FABRICATING THREE-DIMENSIONAL SEMICONDUCTOR STRUCTURES

(71) Applicant: Tokyo Electron Limited, Tokyo (JP)

(72) Inventors: Soo Doo Chae, Albany, NY (US); Karthikeyan Pillai, Albany, NY (US); Lior Huli, Albany, NY (US); Na Young Bae, Albany, NY (US); Hojin Kim, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 560 days.

(21) Appl. No.: 17/472,213

(22) Filed: Sep. 10, 2021

(65) Prior Publication Data

US 2022/0115399 A1    Apr. 14, 2022

Related U.S. Application Data

(60) Provisional application No. 63/089,110, filed on Oct. 8, 2020.

(51) Int. Cl.
*H10B 43/27*    (2023.01)
*H10B 43/10*    (2023.01)

(52) U.S. Cl.
CPC .............. *H10B 43/27* (2023.02); *H10B 43/10* (2023.02)

(58) Field of Classification Search
CPC ................. H10B 43/27; H10B 43/10
See application file for complete search history.

(56) References Cited

U.S. PATENT DOCUMENTS

| | | | |
|---|---|---|---|
| 9,653,475 B1* | 5/2017 | Yoshimizu | H01L 21/02164 |
| 9,728,551 B1* | 8/2017 | Lu | H01L 21/3003 |
| 2021/0398987 A1* | 12/2021 | Hopkins | H10B 69/00 |
| 2022/0005819 A1* | 1/2022 | Howder | H10B 43/27 |
| 2022/0013534 A1* | 1/2022 | Chandolu | H10B 41/35 |
| 2022/0102394 A1* | 3/2022 | Liu | H10B 12/03 |

OTHER PUBLICATIONS

Hausmann, Dennis, "Tech Brief: A Look at Atomic Layer Deposition (ALD)", https://blog.lamresearch.com/author/dennis-hausmann/, May 15, 2017, 8 pages.

Yu, Yongsik, "Tech Brief: Memory "Grows Up" with 3D NAND", https://blog.lamresearch.com/author/yongsik-yu, Apr. 11, 2016, 8 pages.

\* cited by examiner

*Primary Examiner* — Mohammad M Choudhry
(74) *Attorney, Agent, or Firm* — Slater Matsil, LLP

(57) ABSTRACT

In certain embodiments, a method of fabricating a device includes forming, on a substrate, a layer stack of alternating layers of a first spin-on material and a second spin-on material. Each layer of the first spin-on material and the second spin-on material is formed by spin-on deposition. The method includes etching first openings through the layer stack and filling the first openings with a third material. The method includes etching second openings through the layer stack, removing the first spin-on material from the layer stack, and replacing the first spin-on material with a fourth material. The fourth material is a first metal-containing material.

20 Claims, 27 Drawing Sheets

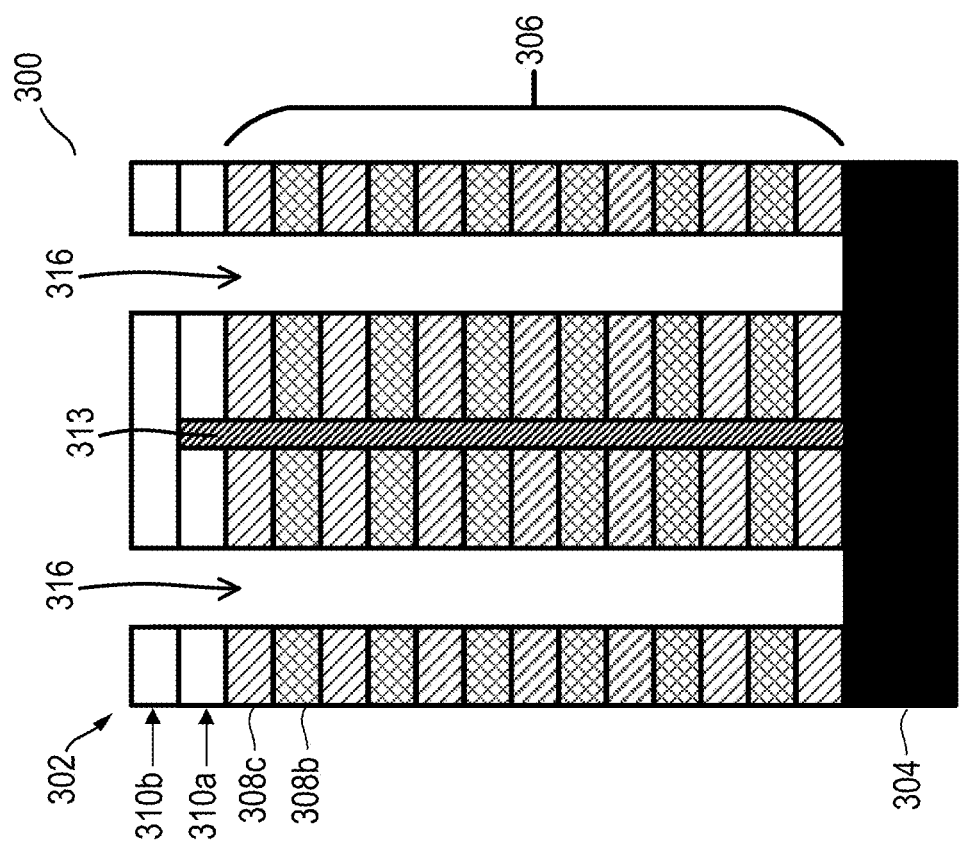
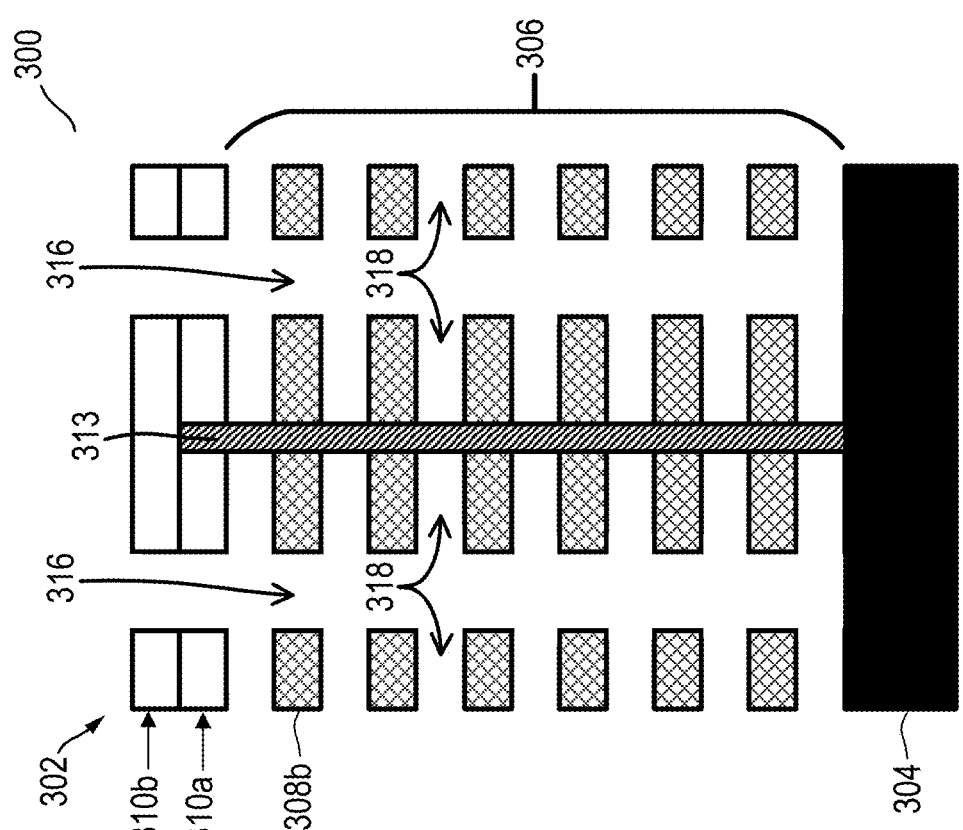

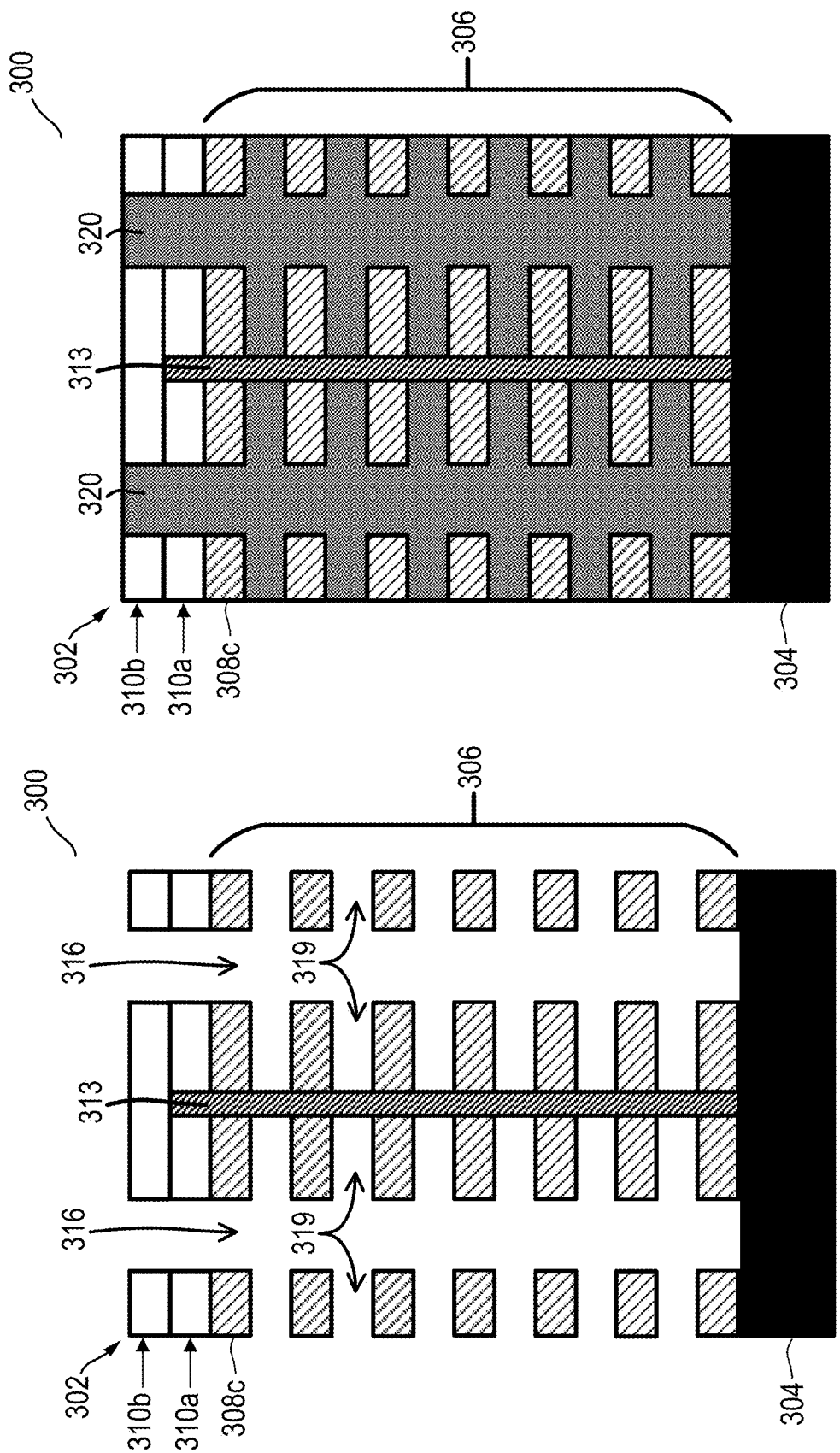

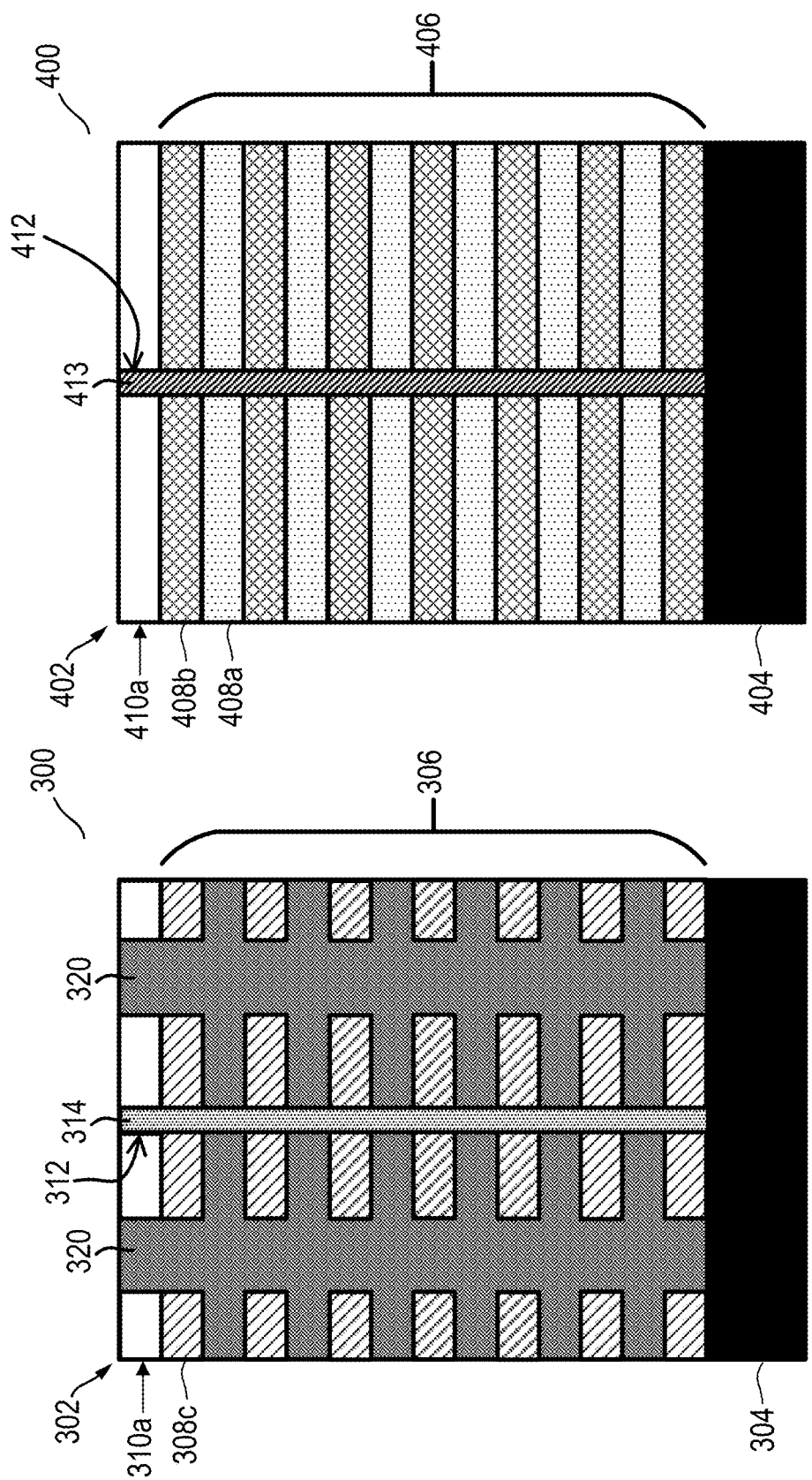

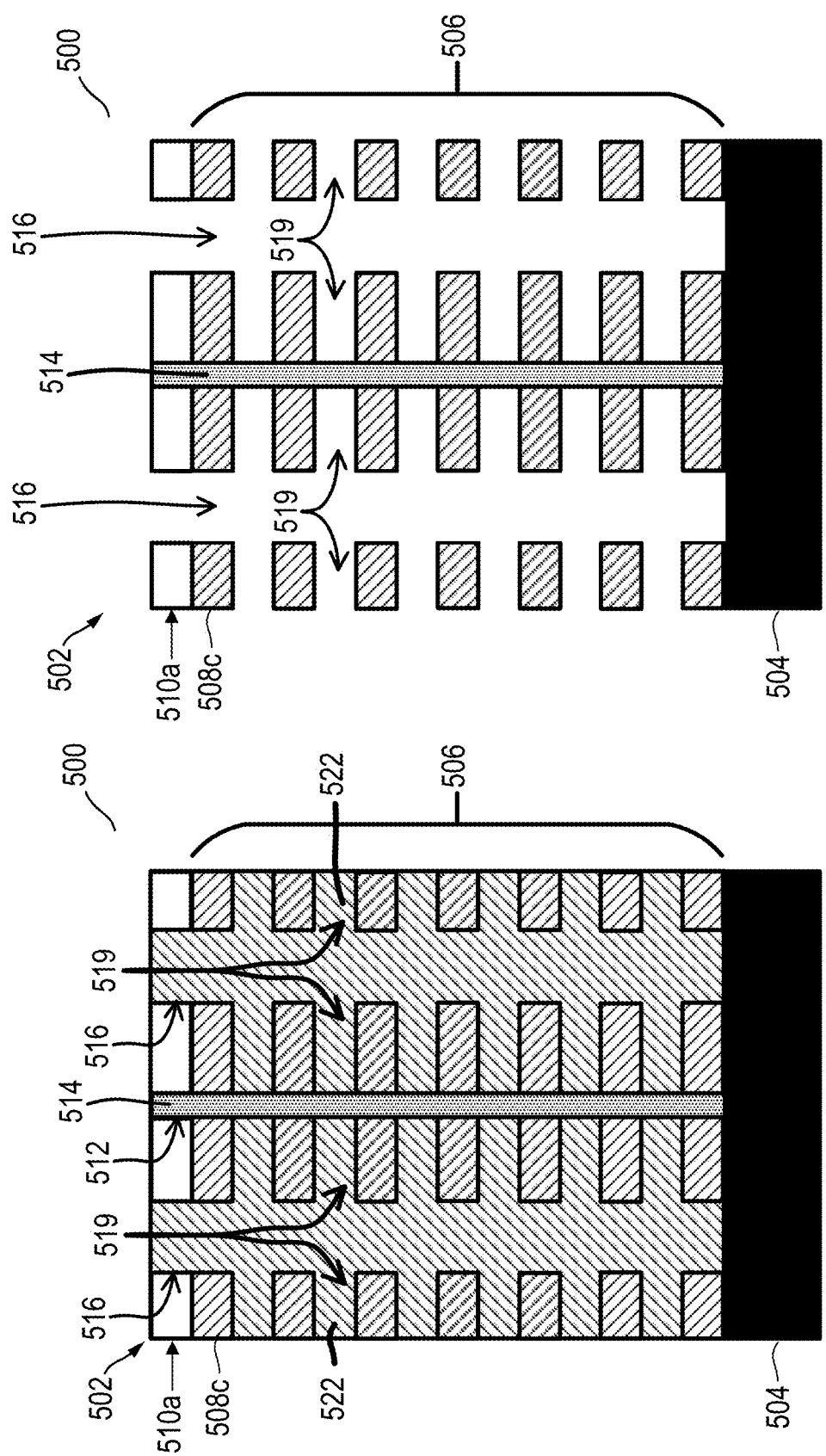

FABRICATING THREE-DIMENSIONAL SEMICONDUCTOR STRUCTURES

CROSS-REFERENCE TO RELATED APPLICATIONS

This application claims the benefit of U.S. Provisional Application No. 63/089,110, filed on Oct. 8, 2020, which is incorporated by reference.

TECHNICAL FIELD

This disclosure relates generally to the field of semiconductors, and, in certain embodiments, to fabricating three-dimensional (3D) semiconductor structures.

BACKGROUND

Device formation within microelectronic workpieces typically involves a series of manufacturing techniques related to the formation, patterning, and removal of layers of material on a substrate. To meet the physical and electrical specifications of current and next generation semiconductor devices, process flows are being requested to reduce feature size while maintaining structure integrity for various patterning processes.

3D structures are becoming common formations on microelectronic workpieces to increase device density. Examples of such 3D structures for microelectronic workpieces include fin field-effect transistors (FINFETs), 3D memory structures, and/or other 3D structures. As the density requirements increase, however, improvements are needed to reduce production costs and to maintain device integrity and performance in 3D structures such as 3D memory structures.

In the case of typical two-dimensional (2D) or planar semiconductor devices, integration may be determined by the area occupied by a unit memory cell, which can be related to the level of fine patterning technology used to form those cells. The expense associated with the processing equipment used with fine patterning may, however, limit the integration for 2D or planar semiconductor devices. To overcome such a limitation, 3D semiconductor devices, including three-dimensionally-arranged memory cells, such as in 3D vertical NAND (VNAND) memory structures, have been used.

SUMMARY

In certain embodiments, a method of fabricating a device includes forming, on a substrate, a layer stack of alternating layers of a first spin-on material and a second spin-on material. Each layer of the first spin-on material and the second spin-on material is formed by spin-on deposition. The method includes etching first openings through the layer stack and filling the first openings with a third material. The method includes etching second openings through the layer stack, removing the first spin-on material from the layer stack, and replacing the first spin-on material with a fourth material. The fourth material is a first metal-containing material.

In certain embodiments, a method includes forming, on a substrate, a layer stack that includes alternating layers of a first spin-on material and a second spin-on material. Each layer of the first spin-on material of the layer stack and the second spin-on material of the layer stack is formed by spin-on deposition. The method includes etching first openings through the layer stack, filling the first openings with a first fill material, etching second openings through the layer stack, removing the first spin-on material from the layer stack, and replacing the first spin-on material with a fourth material. The fourth material is an oxide or a nitride. The method further includes removing the fill material from the first openings, replacing the fill material with a fifth material, removing the second spin-on material from the layer stack, and replacing the second spin-on material with a sixth material.

In certain embodiments, a method for fabricating a 3D NAND device includes forming, on a substrate, a layer stack of alternating layers of a first spin-on material and a second spin-on material. Each layer of the first spin-on material and the second spin-on material is formed by spin-on deposition. The method includes etching channel holes through the layer stack, filling the channel holes with a third material, and etching slits through the layer stack. The slits expose the alternating layers of the layer stack. The method further includes removing the first spin-on material from the layer stack by exposing the layers of the first spin-on material to a first etch chemistry. The method further includes replacing the first spin-on material with a fourth material. The fourth material is an insulating material that comprises an oxide or a nitride. The method further includes removing the second spin-on material from the layer stack by exposing the layers of the second spin-on material to a second etch chemistry. The method further includes replacing the second spin-on material with a fifth material, the fifth material being a metal-containing material.

Different or additional features, variations, and embodiments also can be implemented, and related systems and methods can be used as well.

BRIEF DESCRIPTION OF THE DRAWINGS

For a more complete understanding of this disclosure, and advantages thereof, reference is made to the following descriptions taken in conjunction with the accompanying drawings, in which:

FIGS. 3A-3G illustrate cross-sectional and plan views of an example semiconductor structure during an example process for forming a 3D semiconductor structure, according to certain embodiments;

FIGS. 4A-4E illustrate cross-sectional and plan views of an example semiconductor structure during an example process for forming a 3D semiconductor structure, according to certain embodiments;

FIGS. 5A-5E illustrate cross-sectional and plan views of an example semiconductor structure during an example process for forming a 3D semiconductor structure, according to certain embodiments;

DETAILED DESCRIPTION OF ILLUSTRATIVE EMBODIMENTS

To increase density and lower cost-per-bit for memory devices, 3D memory structures have been formed using current processes. For example, 3D VNAND memory cells have been developed using 3D stacked structures. Fabricating such 3D semiconductor structures may include forming stacked films of alternating materials, such as an oxide-nitride-oxide-nitride (ONON) alternating stack or an oxide-polysilicon-oxide-polysilicon (OPOP) stack. These stacks can include as many as 200 layers or more, and sometimes greater than 300 layers. Additionally, stack height is expected to grow in the future.

Unlike planar NAND (e.g., 2D NAND), however, 3D VNAND stacked films may create stresses to the wafer, which may cause wafer bowing and/or other defects. As layer stack height (including additional layers in the layer stack) for 3D VNAND devices continues to increase, a corresponding manufacturing cost increases as well. For example, to create the stacked films of these 3D semiconductor devices, the plasma processes used to deposit the layers of the stacked film may be performed repeatedly, such as once for each layer of the stack. Repeatedly performing these processes is expensive, both in manufacturing time and cost of materials/equipment. Furthermore, repeatedly performing these plasma deposition processes greatly stresses the wafer, which can result in defects such as wafer bowing. These stresses and bowing may impact the ability to achieve precise lithography overlay during fabrication of the 3D semiconductor structure, and ultimately can detrimentally affect device performance.

FIGS. 1A-1F illustrate cross-sectional views of an example semiconductor structure 102 during an example conventional process 100 for forming a 3D VNAND structure. For example, process 100 may be a typical 3D VNAND integration technique.

Figure 1B:
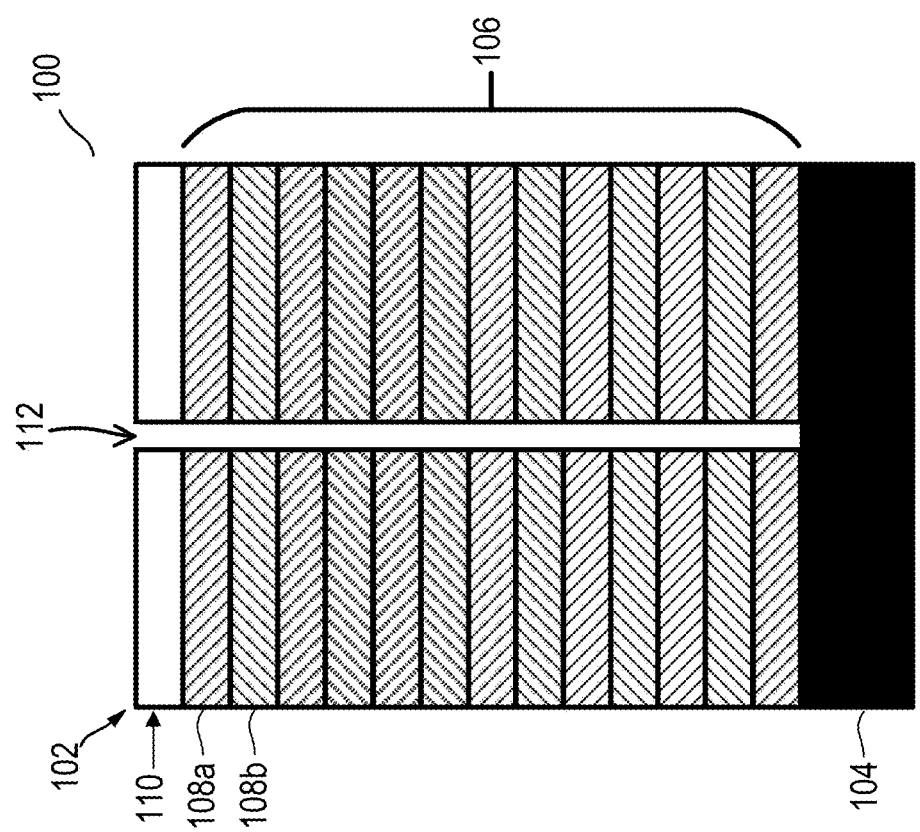
FIGS. 1A-1F illustrate cross-sectional views of an example semiconductor structure during an example conventional process for forming a 3D VNAND structure.
Figure 1A:
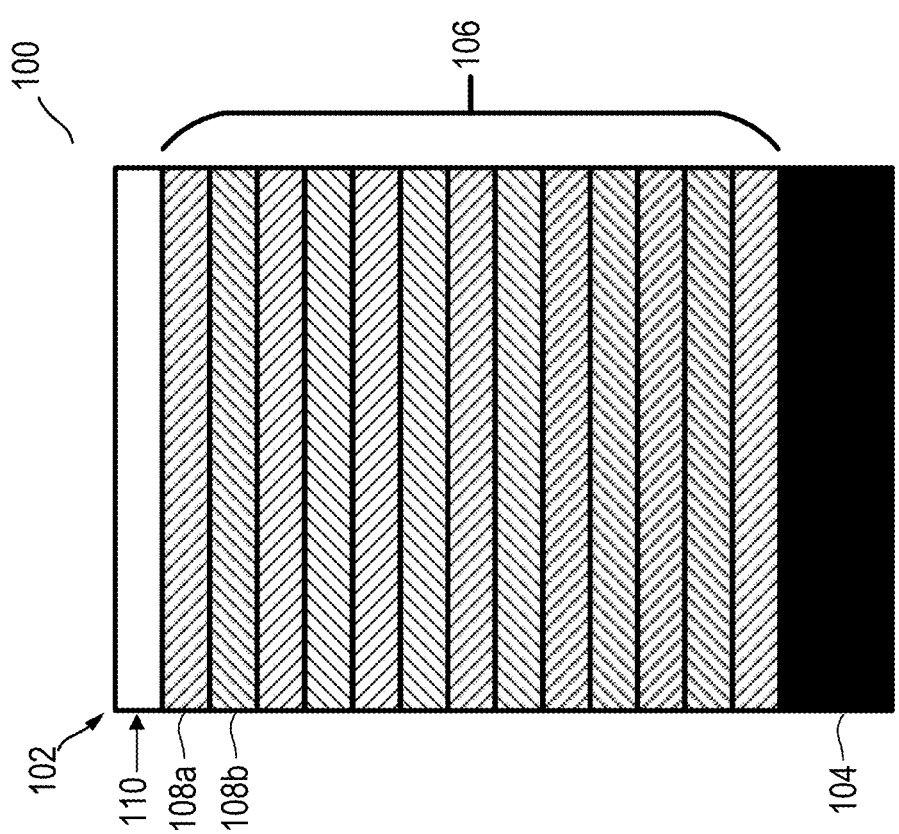

As shown in FIG. 1A, structure 102 includes a substrate 104 and a layer stack 106 formed on substrate 104. Substrate 104 may include a substrate material suitable for use in a memory device.

Initially, layer stack 106 includes alternating layers 108a and 108b, which may be referred to collectively as layers 108, of oxide (e.g., silicon dioxide ($SiO_2$)) and nitride (e.g., silicon nitride (SiN)), respectively. Layer stack 106 also may be referred to as a wafer stack. Although layer stack 106 is shown to include a particular number of layers 108, layer stack 106 may include as few as two layers 108 and upwards of one-hundred layers 108 or more. The number of layers 108 expected to be a part of layer stack 106 likely will continue to increase over time, increasing the deposition process instances. This may further stress structure 102, potentially worsening defects in structure 102. Furthermore, the additional instances of the deposition processes further add to the costs associated with forming structure 102.

A hardmask layer 110 may be formed over layer stack 106, which may be used as an etch mask for subsequent etch steps. Hardmask layer 110 may include a material suitable for use in the etch process to be performed, considering selectivity of the etch process being performed. In certain embodiments, hardmask layer 110 is silicon nitride (e.g., SiN ($Si_3N_4$)) but may include any suitable material.

As shown in FIG. 1B, channel holes 112 are formed in layer stack 106 through layers 108. Although a single channel hole 112 is shown in the cross-sectional view, one of skill in the art will understand that additional channel holes 112 may be formed. Hardmask layer 110 may be patterned (e.g., using one or more photolithography processes) to form openings in hardmask layer 110 that align with the desired locations of channel holes 112, and then channel holes 112 may be formed in layer stack 106 using the patterned hardmask layer 110 as an etch mask. Channel holes 112 are openings for forming the channels of the VNAND memory device being formed.

Figure 1D:
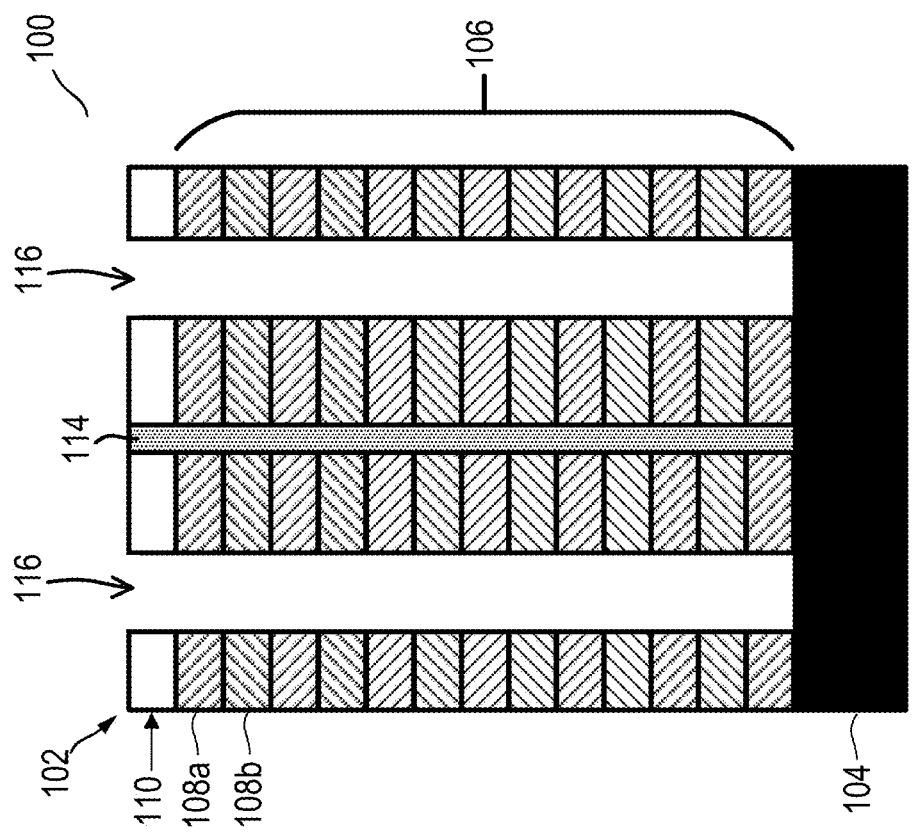
Figure 1C:
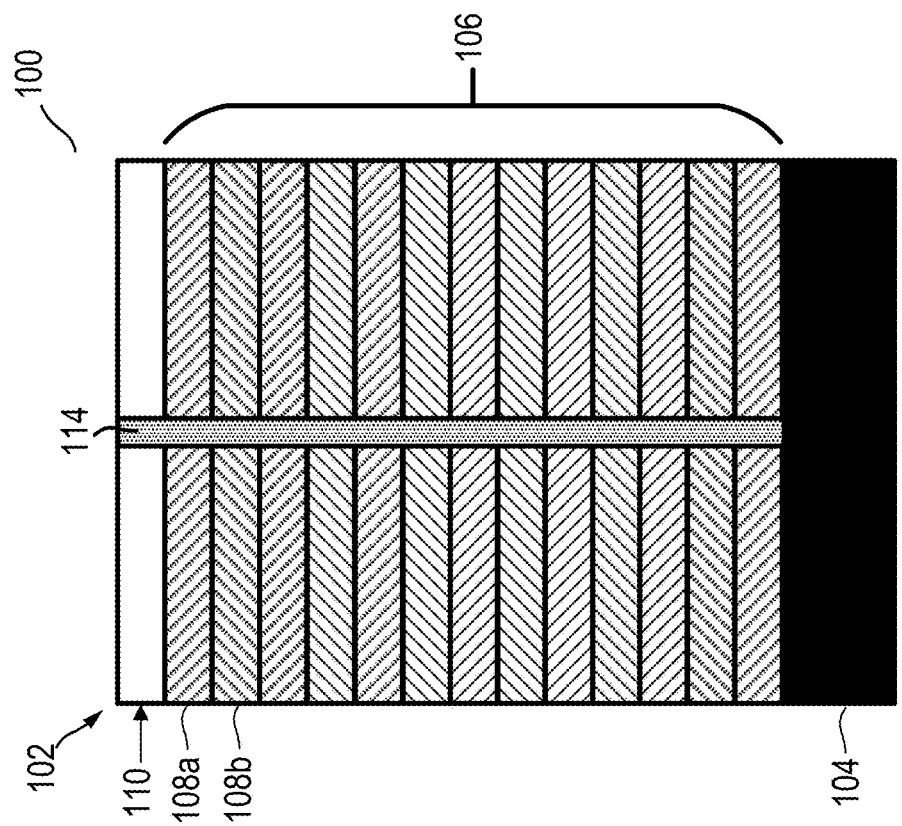

As shown in FIG. 1C, channels holes 112 are filled with channel material 114 for forming the channel of the VNAND memory device being formed. Channel material 114 may include an oxide-nitride-oxide (ONO) memory stack and polysilicon material to form the polysilicon channel.

As shown in FIG. 1D, slits 116 are etched in layer stack 106 using a different etch mask compared to the etch mask used to form channel holes 112. That is, the hardmask layer 110 shown in FIG. 1B and the hardmask layer 110 shown in FIG. 1D may be different instances of hardmask layer 110 that are patterned differently according to the desired locations of channel holes 112 and slits 116, respectively.

Figure 1F:
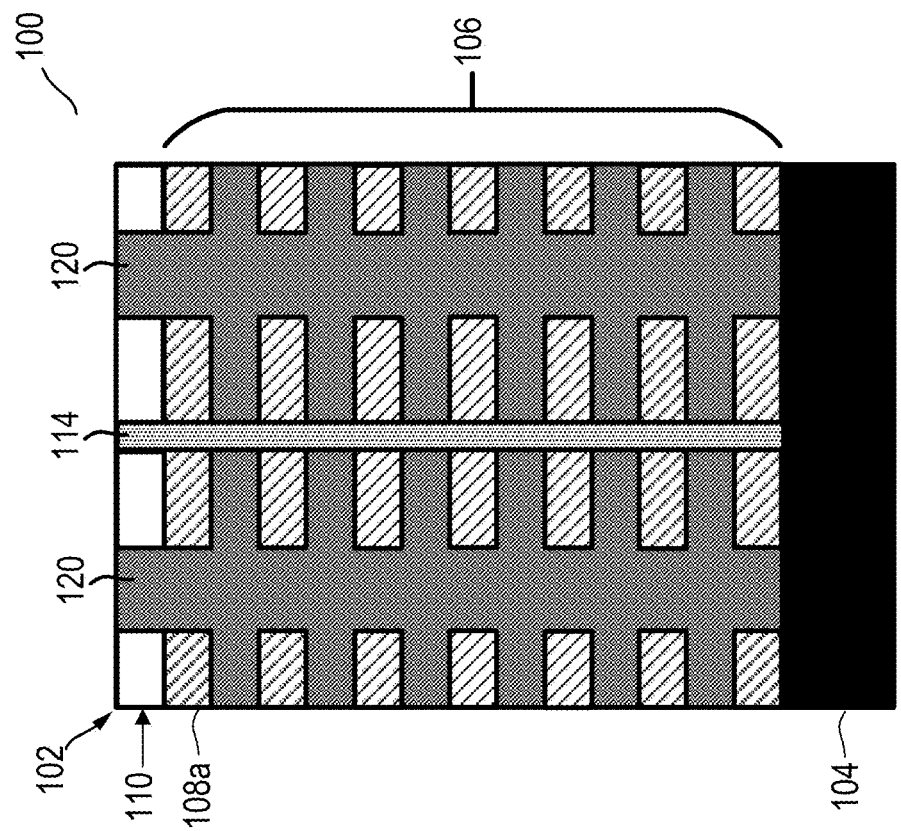
Figure 1E:
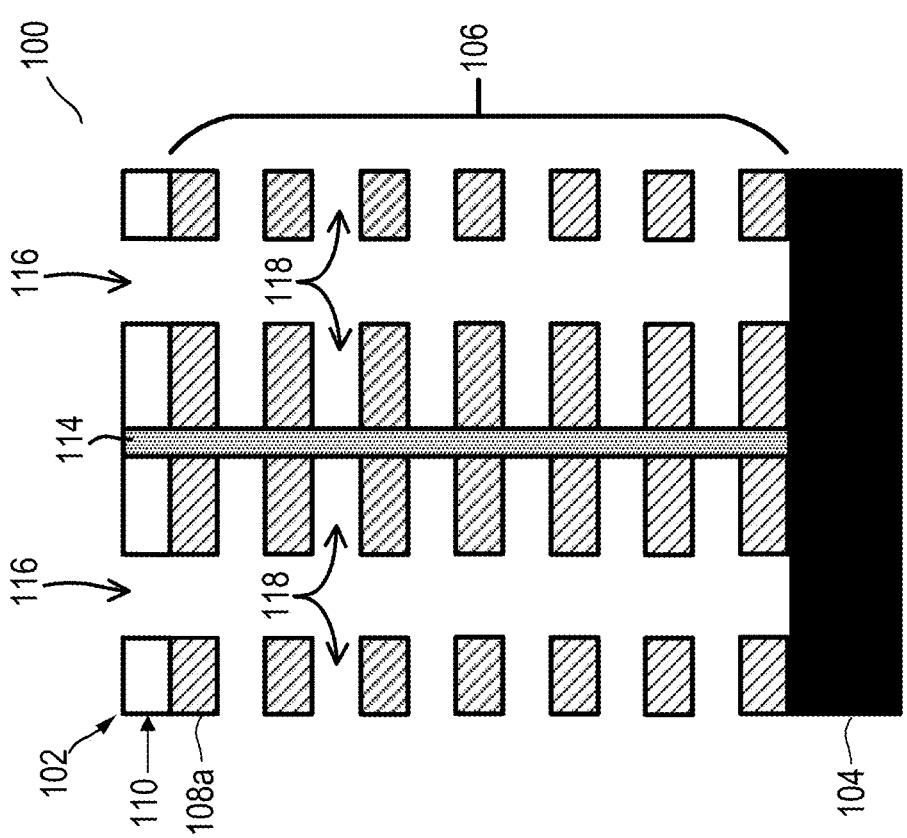

As shown in FIG. 1E, layers 108b (nitride, such as SiN) are removed from layer stack 106, such as by using a phosphoric acid ($H_3PO_4$) wet etch or a vapor phase etching process to isotropically etch layers 108b. In addition to voids created by slits 116, removing layers 108b leaves voids 118 within layer stack 106 where layers 108b were previously located.

As shown in FIG. 1F, slits 116 and voids 118 are filled with metal material 120. For example, metal material 120 may include a combination of aluminum oxide ($AlO_x$), titanium nitride (TiN), and tungsten (W).

According to conventional techniques, layer stack 106 (e.g., as formed at FIG. 1A) may be formed by repeatedly depositing layers 108a and 108b in an alternating arrangement using a chemical vapor deposition (CVD) process, a plasma-enhanced PVD (PECVD) process, a physical vapor deposition (PVD) process, or a plasma-enhanced PVD (PEPVD) process. These deposition processes are expensive, both in terms of time (e.g., low throughput) and money (e.g., for materials, equipment (including wear and tear), and other items). Furthermore, each instance of performing the deposition process stresses structure 102, such as producing high internal stress, which over time can introduce defects, such as bowing of structure 102.

Certain embodiments of this disclosure include processes to reduce manufacturing cost of 3D semiconductor structures, such as 3D memory devices, as well as reduce overlay and internal stress concerns. Techniques herein include using spin-on films and sacrificial coatings. Spin-on films may create a low-stress wafer and may facilitate high throughput in fabricating such 3D semiconductor structures, and may have a relatively low cost of deposition. Certain embodiments may be particularly useful for 3D VNAND devices or other 3D semiconductor structures.

In certain embodiments, the spin-on materials used may include spin-on glass (SOG), spin-on carbon (SOC), silicon oxycarbide (SiOC), organic dielectric layer (ODL), organic planarization layer (OPL), spin-on hardmask (SOH), metal oxide, silicon oxynitride (SiON), silicon oxycarbonitride (SiOCN), silicon nitride (SiN), silicon, silicon carbide (SiC), photoresist, bottom anti-reflective coating (BARC), developable BARC (DBARC), photosensitive film material, among others. Sacrificial materials can include materials suitable for deposition by atomic layer deposition (ALD) or chemical vapor deposition (CVD), such as silicon dioxide ($SiO_2$), SiN, SiON, SiC, SiOC, and metal oxides.

In general, certain embodiments of this disclosure include forming an initial layer stack of sacrificial materials using spin-on deposition processes, and then removing and replacing those sacrificial materials through various processes to achieve the desired layer stack for a 3D semiconductor structure. Rather than the expensive and stress-inducing processes associated with directly building an initial layer stack having the desired layers, the sacrificial materials of the initial layer stack are deposited using spin-on techniques, which may be relatively quick and less stress-inducing. Furthermore, the deposited desired layers that replace the sacrificial layers each may be deposited in a single deposition step, such as using an ALD or other CVD process.

Different or additional features, variations, and embodiments also can be implemented, and related systems and methods can be used as well. Other advantages and implementations can also be achieved while still taking advantage of the structures and process techniques described herein.

FIGS. 2A-2I, 3A-3G, 4A-4E, 5A-5E, and 6A-6G illustrate cross-sectional views, and in some cases plan views, of example processes for forming 3D semiconductor structures according to certain embodiments. For each of these figures, it should be understood that the illustrated example merely shows a portion of a semiconductor structure undergoing processing and that the illustrated structure may extend into and out of the page and/or to the left, right, top, and/or bottom of the illustrated portion. Throughout this disclosure a semiconductor structures also may refer to, or be referred to as, a device, a semiconductor device, a wafer, or the like. In certain embodiments, the illustrated processes are for forming semiconductor structures into a 3D memory structure, such as a 3D VNAND structure.

FIGS. 2A-2I illustrate cross-sectional and plan views of an example semiconductor structure 202 during an example process 200 for forming a 3D semiconductor structure, according to certain embodiments.

Figure 2A:
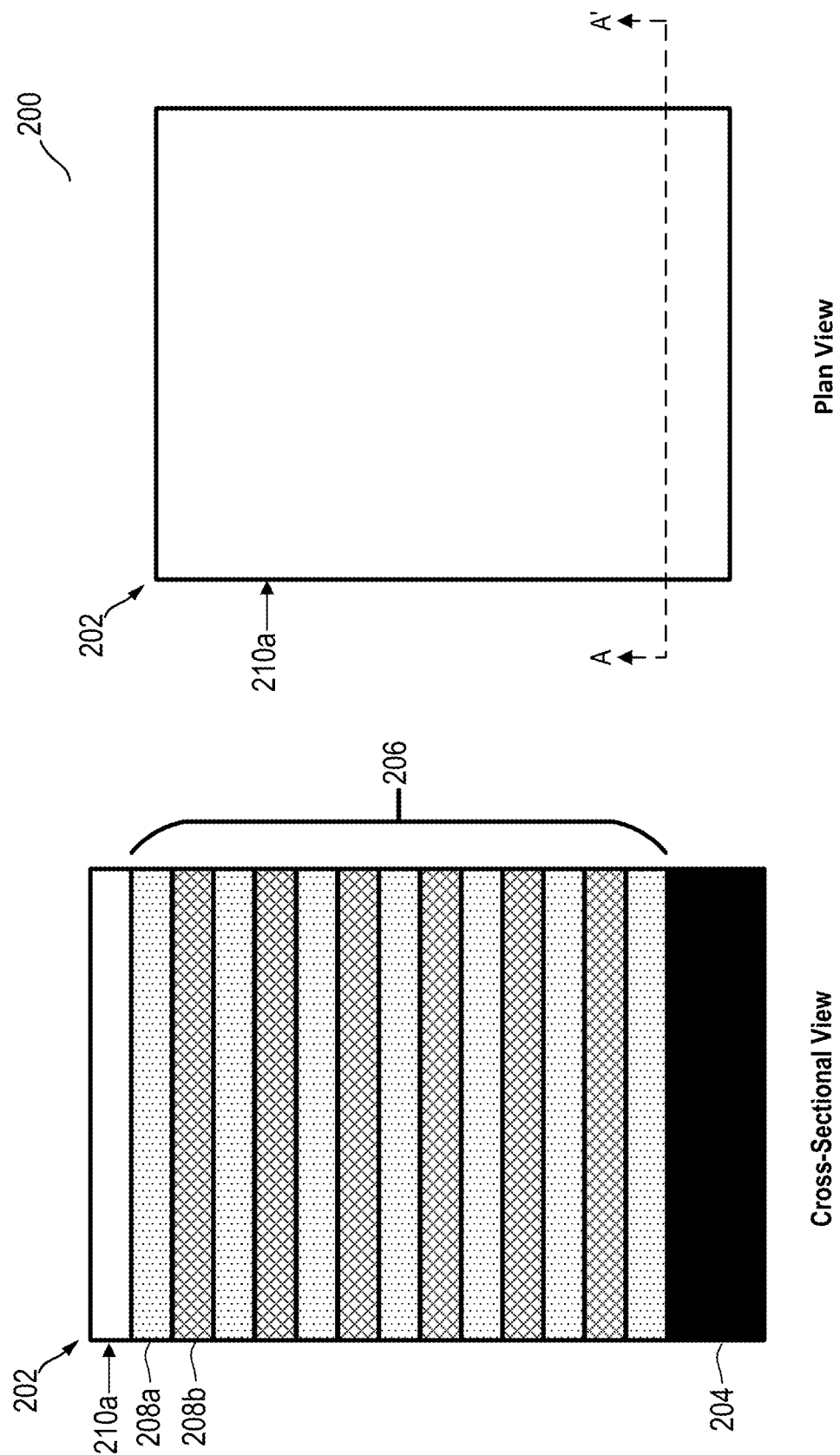
FIGS. 2A-2I illustrate cross-sectional and plan views of an example semiconductor structure during an example process for forming a 3D semiconductor structure, according to certain embodiments.

As shown in FIG. 2A, structure 202 includes a substrate 204 and a layer stack 206 formed on substrate 204. The cross-sectional view of structure 102 of FIG. 2A is taken along a cross-section A-A' of the plan view of semiconductor structure 102. A similar cross-section A-A' is used in FIGS. 2B-2I.

Substrate 104 may include any substrate material(s) suitable for use in forming a 3D semiconductor structure, such as a 3D memory device. For example, substrate 204 may be or include silicon.

Initially, layer stack 206 may include alternating layers 208a and 208b, which may be referred to collectively as layers 208. Layer stack 206 also may be referred to as a wafer stack or a multilayer stack. Layers 208 may be formed using spin-on deposition techniques. In certain embodiments, the spin-on materials used may include SOG, SOC, SiOC, ODL, OPL, SOH, metal oxide, SiON, SiOCN, SiN, silicon, SiC, photoresist, BARC, DBARC, photosensitive film material, among others. In a particular example, layers 208a are SOG and layers 208b are SOM. SOM may include, for example, $AlO_x$, titanium oxide ($TiO_x$), $ZrO_x$, and the like. Thus, in a particular example, layer stack 206 is formed by depositing, using spin-on deposition techniques, alternating layers 208 of SOG (e.g., as layers 208a) and SOM (e.g., as layers 208b).

In certain embodiments, spin-on deposition (which also may be referred to as spin-coating) includes depositing a particular material (e.g., the material of a layer 208 being deposited) on an underlying layer (e.g., substrate 204 for the first layer 208 or an underlying layer 208 for subsequent layers 208 of layer stack 206). Structure 202 then may be rotated (if not already rotating, possibly at a relatively low velocity) at a relatively high velocity so that centrifugal force causes deposited material to move toward edges of structure 202, thereby forming a thin layer (e.g., a layer 208). Excess material is typically spun off.

Layers 208 of layer stack 106 may be deposited using a coater-developer tool, for example. In certain embodiments, forming a layer 208 using a spin-on coating deposition process includes depositing the layer 208 using a spin-coating process and potentially baking and/or curing the deposited layer 208 following deposition. In certain embodiments, a same tool may be used to perform the deposition, bake, and cure; however, this disclosure contemplates using multiple tools. The bake may be a low-temperature bake step.

Although layer stack 206 is shown to include a particular number of layers 208, layer stack 206 may include any suitable number of layers, including as few as two layers 208 and upwards of one-hundred layers 208, two-hundred layers 208, three-hundred layers 208, or more (potentially hundreds more). The number of layers 208 expected to be a part of layer stack 206 likely will continue to increase over time, increasing the deposition process instances. As just one example, layers 208 may be about 5 nm to about 175 nm thick, and the thicknesses of these layers may be the same or may vary in any suitable combination.

Due at least in part to the potential increased speed of spin-on deposition processes relative to CVD, PECVD, PVD, or PEPVD deposition processes, forming layer stack 206 using spin-on deposition process may allow layer stack 206 to be formed with a greater number of layers 208 with reduced impact on overall processing time relative to a process that uses CVD, PECVD, PVD, or PEPVD deposition processes (e.g., process 100) to directly deposit the layers of the desired layer stack. Additionally or alternatively, due at least in part to the lower cost of spin-on deposition processes relative to CVD, PECVD, PVD, or PEPVD deposition processes, forming layer stack 206 using spin-on deposition process may allow layer stack 206 to be formed at a reduced cost relative to a process that uses CVD, PECVD, PVD, or PEPVD deposition processes (e.g., process 100). Additionally or alternatively, due at least in part to the potentially less stress-inducing characteristics of spin-on deposition processes relative to CVD, PECVD, PVD, or PEPVD deposition processes, forming layer stack 206 using spin-on deposition process may allow layer stack 206 to be formed with a greater number of layers 208 with reduced stress on structure 202 relative to a process that uses CVD, PECVD, PVD, or PEPVD deposition processes (e.g., process 100), which may reduce defects in structure 202, including potentially bowing and problems resulting from bowing.

After a predetermined number of alternating layers 108a and 108b have been deposited as layer stack 206, a masking layer 210a may be deposited on top of layer stack 206. Masking layer 210a may be used as an etch mask for subsequent etch steps. In certain embodiments, masking layer 210a is resistant to etching in a subsequent etching process for forming openings in layer stack 206. Masking layer 210a may include a material suitable for use in the etch process to be performed, considering selectivity of the etch process being performed. In certain embodiments, masking layer 210a is silicon, SiN (e.g., $Si_3N_4$), or a metal hardmask, but masking layer 210a may include any suitable material for use as an etch mask layer. In certain embodiments, masking layer 210a is deposited using an ALD or other CVD deposition process. Throughout FIGS. 2A-2I, masking layers may be referred to generally as masking layers 210 (and similarly in later figures using reference numerals 310, 410, 510, and 610). Masking layers 210 may take any suitable form according to the context in which the masking layer 210 is used.

Figure 2B:
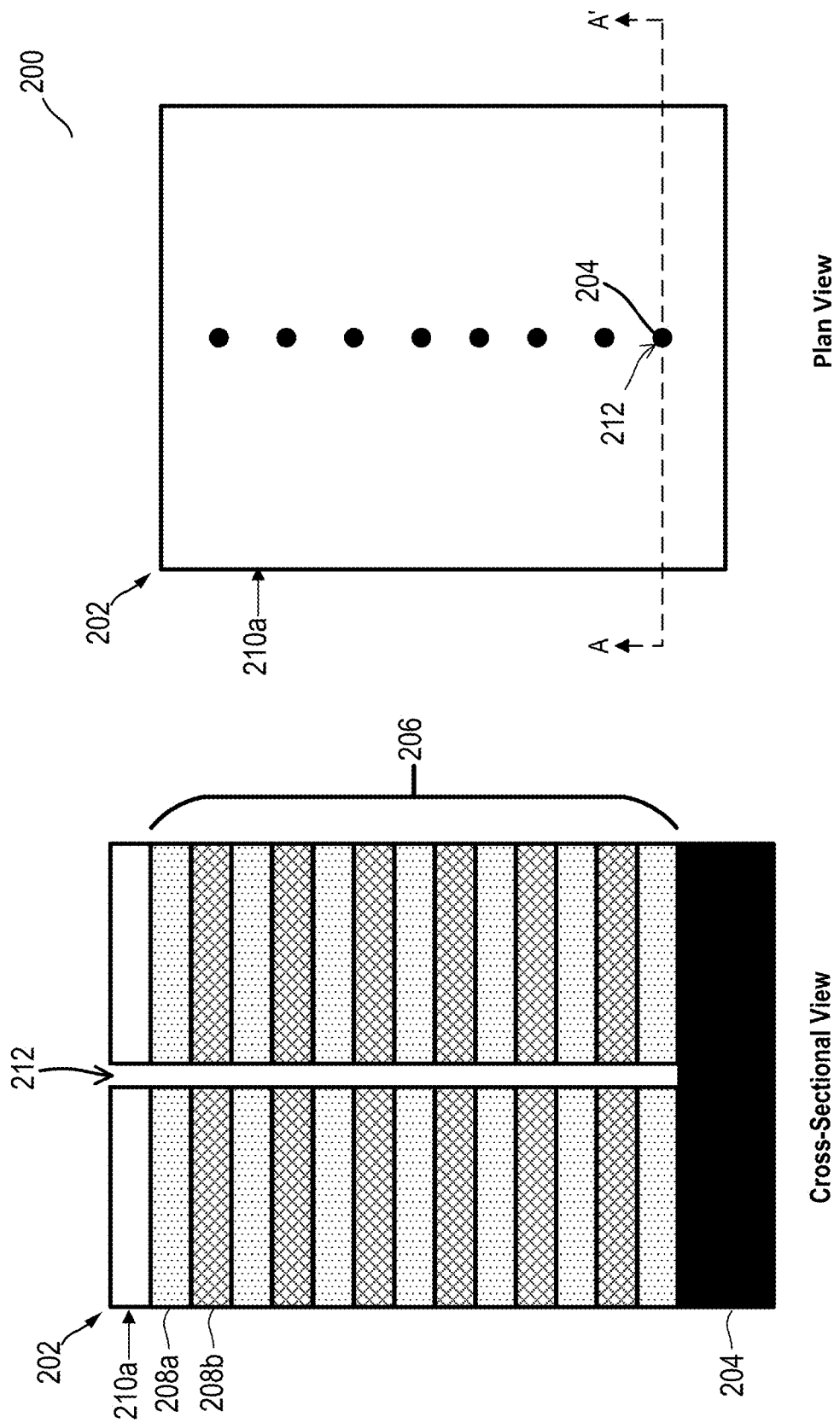

As shown in FIG. 2B, openings 212 are formed in layer stack 206 through layers 208. In the illustrated example, openings 212 are formed through layer stack 206 until a surface of substrate 204 is exposed. As can be appreciated from the plan view of FIG. 2B, multiple openings 212 may be formed in layer stack 206 in any suitable quantity. Furthermore, openings 212 may be formed in any suitable arrangement. Openings 212 may be holes, trenches, vias, or any other suitable type(s) of openings. In certain embodiments, openings 212 are channel holes for forming channels of a 3D semiconductor device under construction (e.g., of a 3D memory device, such as a 3D VNAND device). Although shown to be generally a circular cylinder as they extend through layer stack 206, openings 212 may have any suitable shape.

Openings 212 may be channel holes in which a channel for a semiconductor device, such as a 3D semiconductor device, may be formed. In certain embodiments, openings 212 can be used to form 3D memory cells, with channels for the 3D memory cells being formed in openings 212. For example, 3D VNAND memory cells may be manufactured using openings 212 formed in layer stack 206. Further, single-level cell (SLC) memories, multi-level cell (MLC) memories such as triple-level cell (TLC) and quad-level cell (QTC) memories, and/or other memory or device structures can be formed using these techniques.

To form openings 212, masking layer 210a may be patterned (e.g., using one or more lithography processes) to form openings in masking layer 210a that expose surfaces of layer stack 206 and align with the desired locations of openings 212, and then openings 212 may be etched through layers 208 of layer stack 206 using the patterned masking layer 210a as an etch mask. Lithography processes described herein can be implemented using optical lithography, extreme ultra-violet (EUV) lithography, and/or other lithography processes. In embodiments in which openings 212 ultimately serve as channel holes for forming channels of a device (e.g., a 3D NAND memory device), the pattern of masking layer 210a may be or include a channel pattern. Openings 212 may be formed using any suitable type of etch process, according to particular needs. The etch processes for forming openings 212 within layer stack 206 can include one or more wet etch processes, plasma etch processes, reactive ion etching (RIE) processes, and/or other etch processes or combinations of etch processes.

Figure 2C:
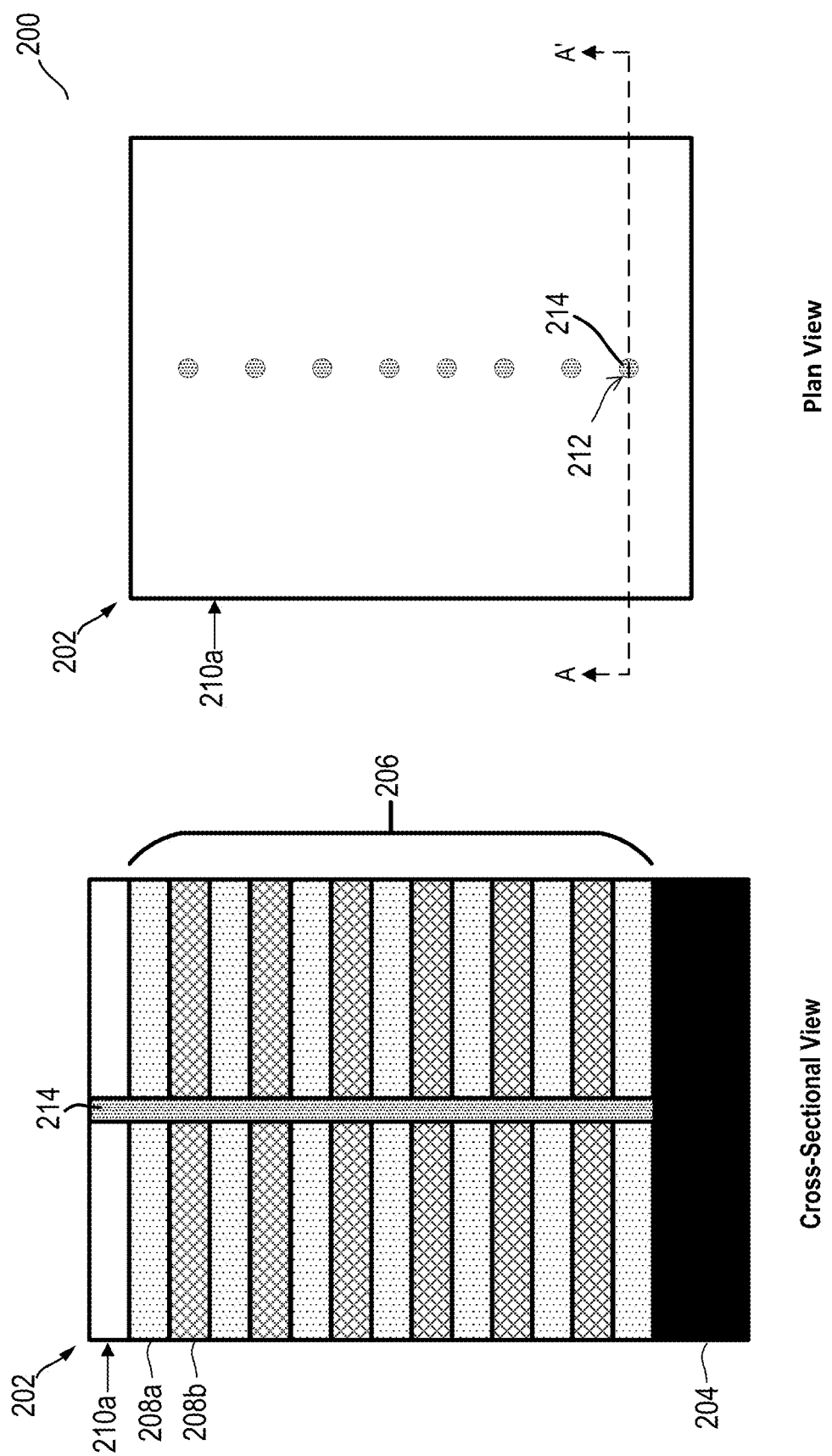

As shown in FIG. 2C, openings 212 may be filled with a channel material 214. In the case of a 3D memory device, channel material 214 may include any material(s) suitable for use as a channel (or portion of a channel) of the 3D memory device. In certain embodiments, channel material 214 may include multiple material layers that include silicon, oxide, SiN, oxide, and silicon (e.g., SONOS structures). In certain embodiments, channel material 214 may include an oxide-nitride-oxide (ONO) memory stack and polysilicon material to form the polysilicon channel. In certain embodiments, openings 212 may be filled with any of $SiO_2$, SiN, $SiO_2$ and polysilicon. For example, depositing channel material 214 may include depositing a layer of oxide (e.g., $SiO_2$), a layer of nitride (e.g., SiN), and another layer of oxide (e.g., $SiO_2$), with a remaining portion of openings 212 being filled with polysilicon. Channel material 214 may be deposited using any suitable type of deposition process or combination of deposition processes. For example, channel material 214 may be deposited using one or more of a CVD process (including, potentially, an ALD process), a PECVD process, a PVD process, a PEPVD process.

In certain embodiments, channel material 214 is deposited in such a way (with a suitable combination of etch and/or deposition processes) so that contact can be made between a layer of channel material 214 that acts as the channel region and a conductive material at a bottom of openings 212, and ultimately to a source or drain line. In certain embodiments, at least a portion of channel material 214 includes a material that acts as a gate dielectric.

Figure 2D:
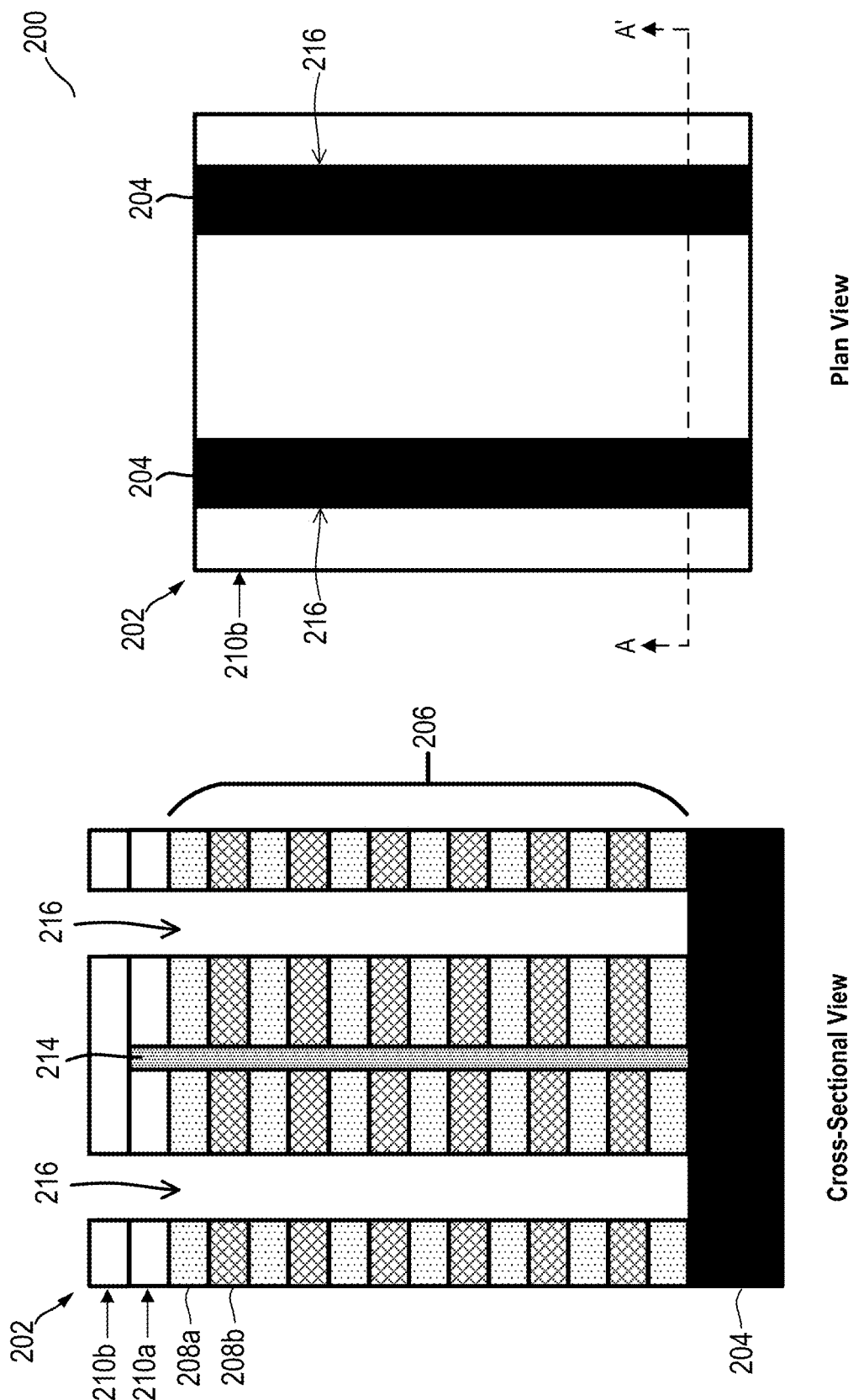

As shown in FIG. 2D, openings 216 are formed in layer stack 206 through layers 208. In the illustrated example, openings 216 are formed through layer stack 206 until a surface of substrate 204 is exposed. In the illustrated example, an opening 216 is formed on each side of a row of openings 212. Multiple openings 216 may be formed in layer stack 206 in any suitable quantity. Furthermore, openings 216 may be formed in any suitable arrangement. Openings 216 may be holes, trenches, vias, or any other suitable type(s) of openings. In certain embodiments, openings 216 are referred to as slits that ultimately will be used to deposit conductive material for one or more gates of a 3D semiconductor device under construction (e.g., of a 3D memory device, such as a 3D VNAND device).

Openings 216 may be formed in any suitable manner. In certain embodiments, a masking layer 210b may be deposited on top of layer stack 206 (e.g., on top of masking layer 210a). Masking layer 210b may be used as an etch mask for subsequent etch steps. In certain embodiments, masking layer 210b is resistant to etching in a subsequent etching process for forming openings 216 in layer stack 206. Masking layer 210b may include a material suitable for use in the etch process to be performed, considering selectivity of the etch process being performed. In certain embodiments, masking layer 210b is silicon, SiN (e.g., $Si_3N_4$), or a metal hardmask, but masking layer 210b may include any suitable material for use as an etch mask layer. In certain embodiments, masking layer 210b is deposited using an ALD or other CVD deposition process.

To form openings 216, masking layer 210b may be patterned (e.g., using one or more lithography processes) to form openings in masking layer 210b that expose surfaces of masking layer 210a and/or layer stack 206 and align with the desired locations of openings 216, and then openings 216 may be etched through masking layer 210a and layers 208 of layer stack 206 using the patterned masking layer 210b as an etch mask. Masking layer 210b may protect channel material 214 from being etched during formation of openings 216. In certain embodiments, rather than depositing a new masking layer 210b on top of masking layer 210a, masking layer 210a may be removed and masking layer 210b may replace masking layer 210a. Openings 216 may be formed using a different etch mask compared to the etch mask used to form openings 212. That is, masking layer 210b and masking layer 210a may be different instances of a masking layer 210 that are patterned differently according to the desired locations of openings 212 and openings 216, respectively. Openings 216 may be formed using any suitable type of etch process, according to particular needs. The etch processes for forming openings 212 within layer stack 206 can include one or more wet etch processes, plasma etch processes, RIE processes, and/or other etch processes or combinations of etch processes. Although shown to be generally a rectangular as they extend through layer stack 206, openings 216 may have any suitable shape.

Figure 2E:
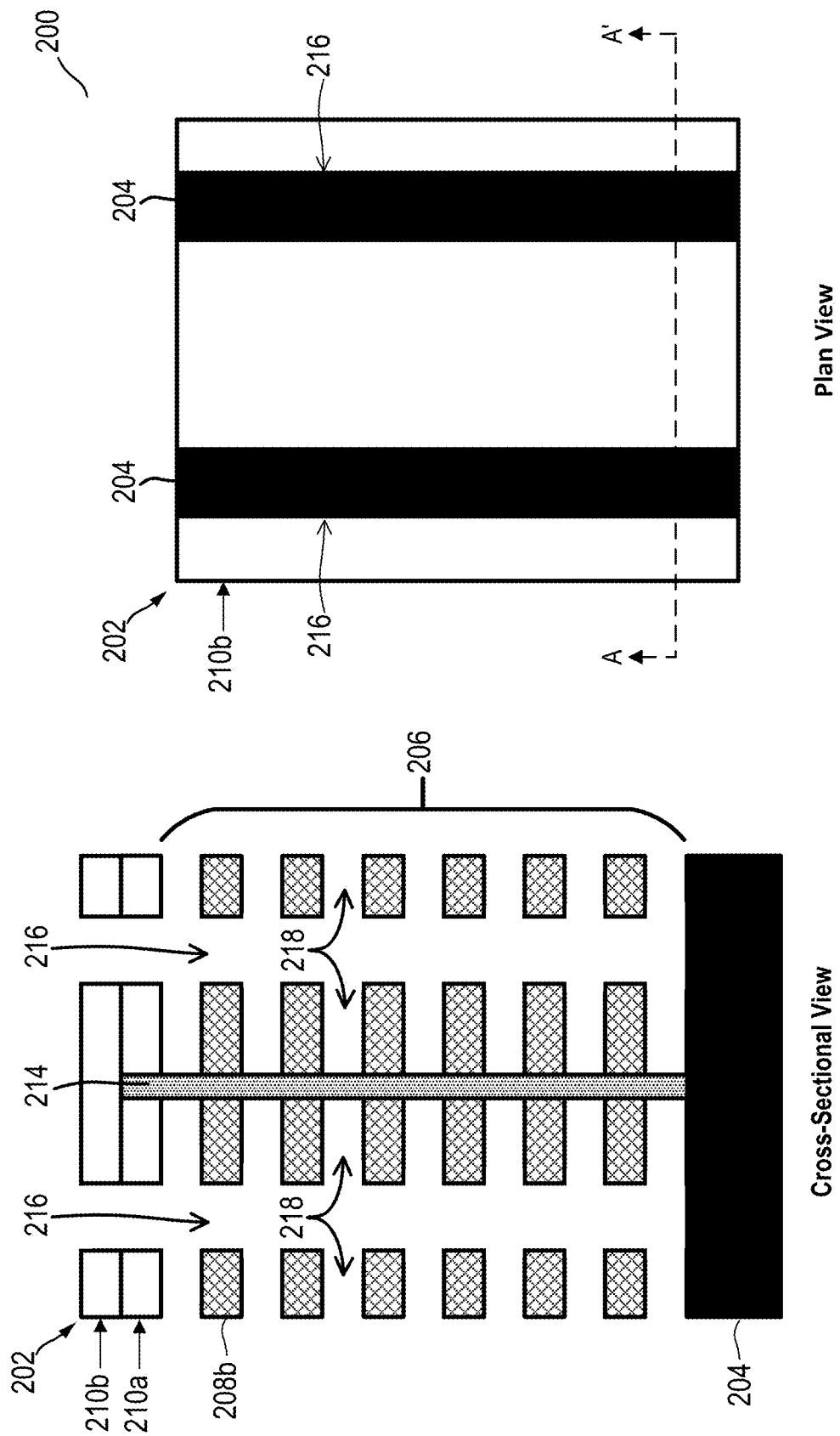

As shown in FIG. 2E, layers 208 of a particular type of material are removed from layer stack 206. In the illustrated example, layers 208a are removed from layer stack 206. As described above, in one example layers 208a are SOG and layers 208b are SOM. Thus, in one example, the SOG (layers 208a) may be removed. In addition to voids created by openings 216, removing layers 208a leaves voids 218 within layer stack 206 where layers 208a were previously located.

This disclosure contemplates using any suitable etch process to remove the set of layers 208 (e.g., layers 208a in this example). A suitable etch process may include an etch process that is selective to etching the layers being removed (e.g., layers 208a in this example) relative to the layers not being removed (e.g., layers 208b in this example). Again referring to an example in which layers 208a are SOG and layers 208b are SOM, with layers 208a (SOG) being removed, a suitable etch process might include dilute hydrofluoric (DHF) acid or vapor phase or plasma etch.

Figure 2F:
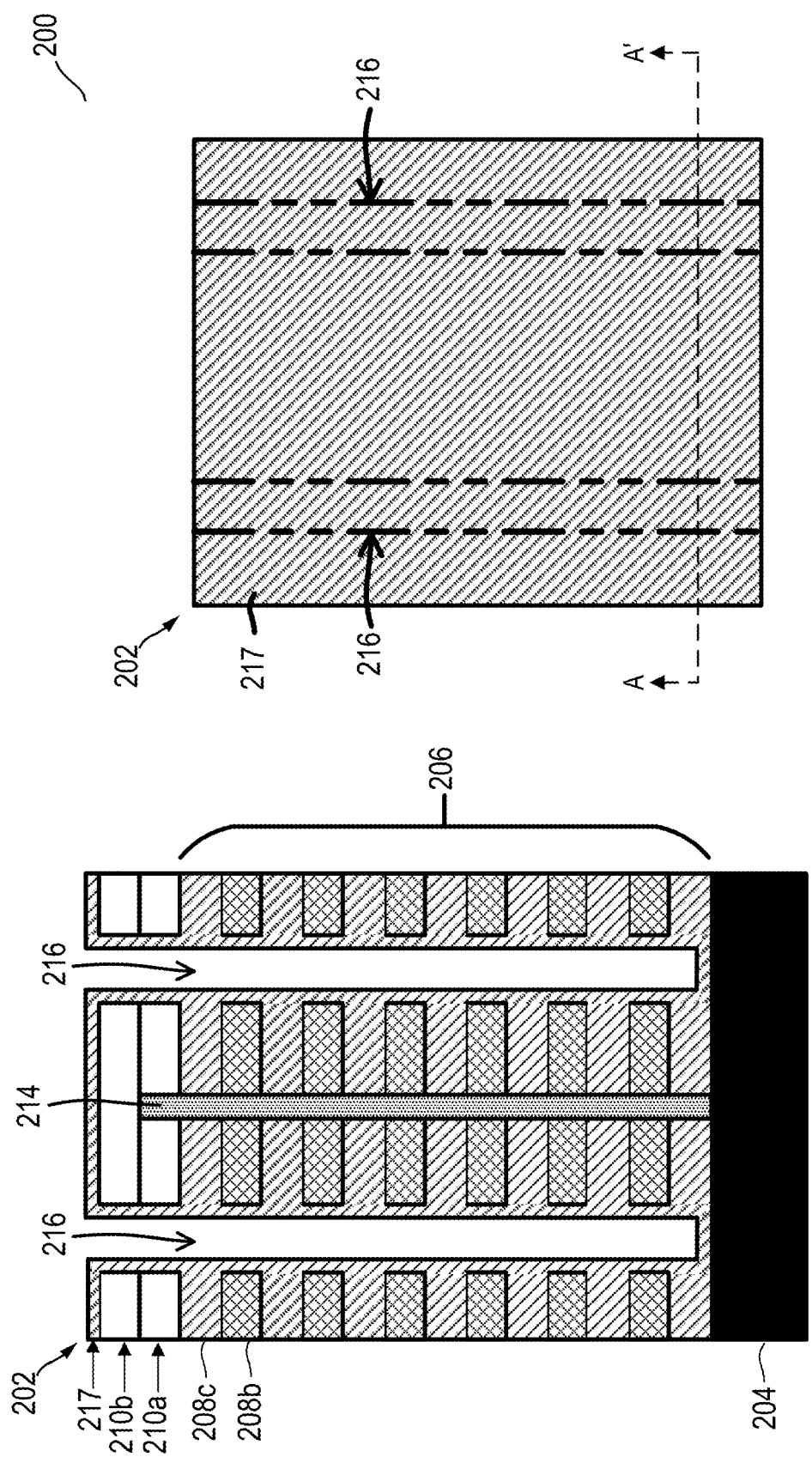

As illustrated in FIG. 2F, removed layers 208a may be replaced with another material (shown as layers 208c). Layers 208c may be formed in any suitable manner. Layers 208c may include any suitable material, such as $SiO_2$, SiN, SiON, SiC, SiOC, and/or metal oxides. As just one example, continuing with the example in which layers 208b are SOM, the material of layers 208c could be oxide (e.g., $SiO_2$). In certain embodiments, the material of layers 208c is an insulating material.

In certain embodiments, to replace removed layers 208b with the material of layers 208c, open spaces in layer stack 206 may be partially or entirely filled with the material that will be layer 208c. For example, voids 218 of layer stack 206 may be filled with the material of layers 208c and openings 216 of layer stack 206 may be partially or entirely filled with the material of layers 208c. For example, the material of layers 208c may be deposited in and fill voids 218 and may extend into openings 216, partially or entirely filling openings 216 as well. In other words, an initial deposition of the material of layers 208c may be executed to fill voids 218 and extending into openings 216. In the illustrated example, excess material 217 (of the material used to form layers 208c) may be deposited as part of this initial deposition. Although excess material 217 is shown to only partially fill openings 216, this disclosure contemplates excess material 217 filling less or more (and potentially all) of openings 216). In certain embodiments, the material of layers 208c (e.g., oxide), including excess material 217, can be deposited below 20 nm. The material of layers 208c may be deposited using any suitable deposition technique or combination of techniques, such as by an ALD or other CVD process.

Figure 2G:
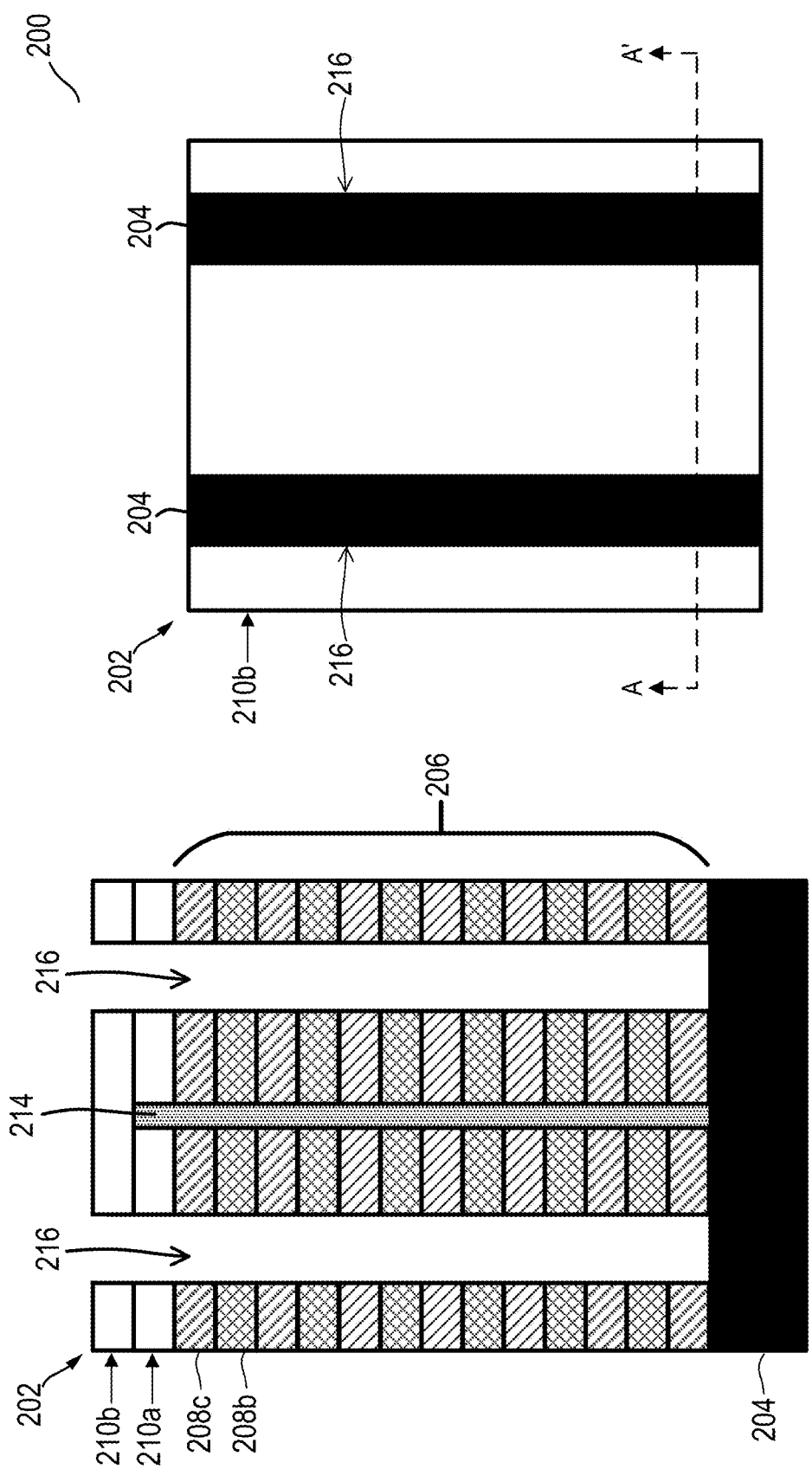

As illustrated in FIG. 2G, excess material 217 may be recessed, essentially re-forming openings 216, to expose the materials of layers 208b within openings 216 and forming layers 208c (with excess material 217 removed). A suitable etch process may be used to remove the deposited material (of layers 208c) within the area of openings 216 (excess material 217), exposing the material of layers 208b and 208c in openings 216. For example, the deposited material (of layers 208c) within the area of openings 216 (excess material 217) may be recessed using a DHF acid, a vapor phase, a plasma etch, or the like. Appropriate etch processes will depend on the materials of layer stack 206. If appropriate, as suitable masking process (e.g., potentially using a new etch mask, such as a new masking layer 210) may be used to facilitate this etch process.

Figure 2H:
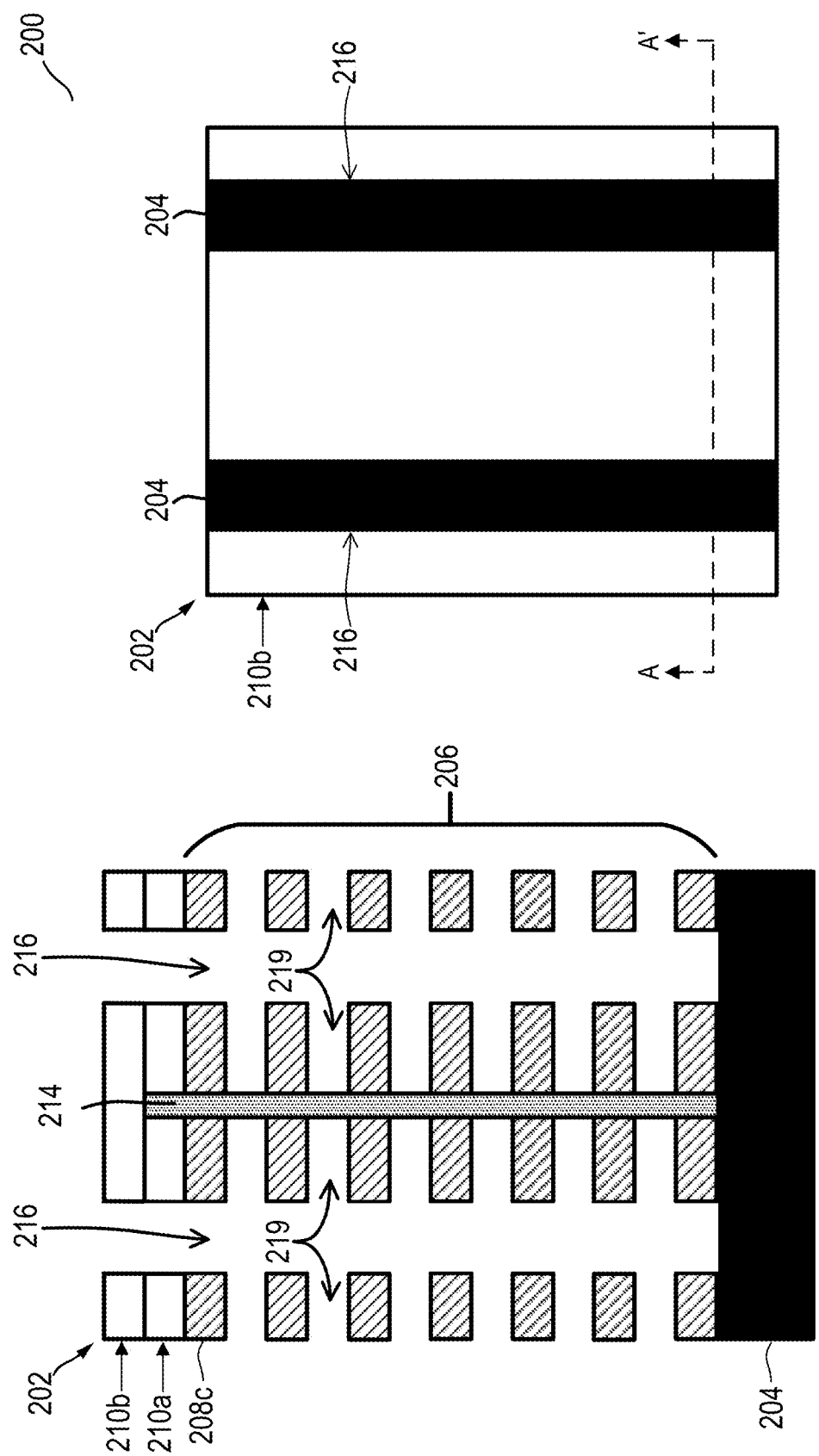

As illustrated in FIG. 2H, layers 208b are removed from layer stack 206. As described above, in one example layers 208b are SOM. Thus, in one example, the SOM (layers 208b) may be removed. In addition to voids created by openings 216, removing layers 208b leaves voids 219 within layer stack 206 where layers 208b were previously located.

This disclosure contemplates using any suitable etch process to remove layers 208b. A suitable etch process may include an etch process that is selective to etching layers 208b relative to layers 208c. Again referring to an example in which layers 208b are SOM and layers 208c are oxide, with layers 208b (SOM) being removed, a suitable etch process might include DHF acid or vapor phase or plasma etch. This may remove all layers 208b from layer stack 206.

Figure 2I:
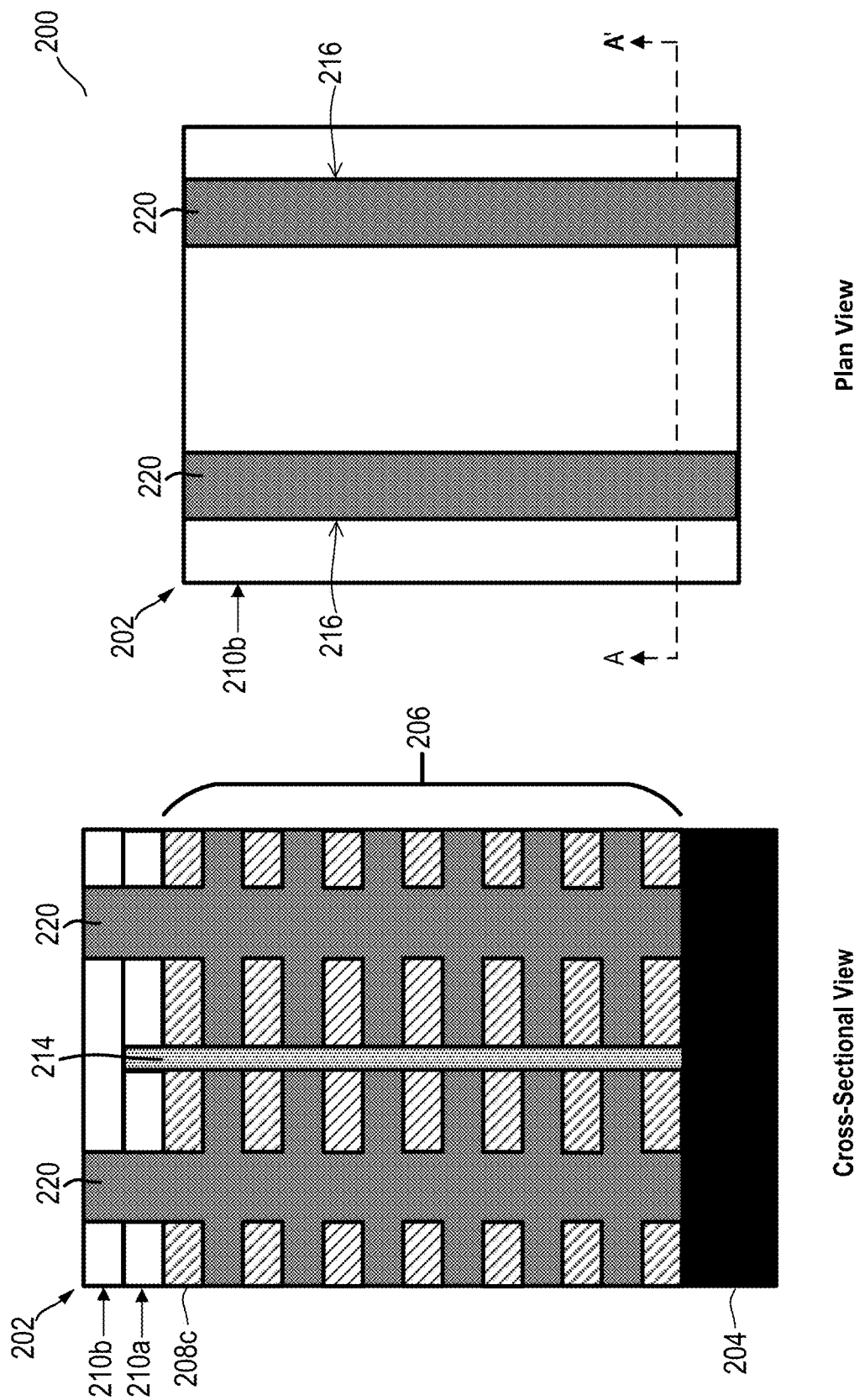

As illustrated in FIG. 2I, open spaces of layer stack 206 may be filled with a material 220. For example, voids 219 (previously occupied by layers 208b) may be filled with material 220 and openings 216 also may be filled with material 220. Material 220 may be a metal-containing material appropriate for the corresponding fabrication process, such as for forming a 3D semiconductor structure (e.g., a 3D VNAND device). In certain embodiments, material 220 may be a metal-containing material suitable for use as a gate in the 3D semiconductor structure being formed. As just one particular example, material 220 may include a combination of $AlO_x$, TiN, and W. Although primarily described as a metal-containing material, material 220 may be any suitable conductive material, such as any material that is suitable for acting as a gate in a transistor (e.g., a gate in a transistor of a 3D NAND memory device). Thus, in certain embodiments, in the state illustrated in FIG. 2I, layer stack 206 includes alternating oxide layers and nitride layers, making layer stack 206 an ONON stack. Other stack types are possible, such as an OPOP stack for example.

Although throughout FIGS. 2A-2I, layer stack 206 has been described as including particular alternating layers 208, layer stack 206 may include other alternating layers of suitable materials.

As can be appreciated from FIGS. 2A-2I and the associated description of process 200, at the state illustrated in FIG. 2A, layer stack 206 initially included alternating layers 208a and 208b that were deposited using spin-on deposition techniques and served as sacrificial layers that are removed and replaced with layers that form layer stack 106 in the state illustrated in FIG. 2I. Furthermore, layers 208a each may be removed and replaced with the material ultimately that will make up layer stack 206 (in the state illustrated in FIG. 2I), with each replacement material potentially being deposited in a single etch step (e.g., using an ALD or other CVD process). Forming layers 208a and 208b of layer stack 106 using spin-on techniques, and subsequent removal and replacement of those sacrificial layers 208a and 208b, potentially saves time and money, and also may reduce stress, and the defects cause by that stress, in semiconductor structure 202 relative to processes that repeatedly perform expensive and harsh deposition process to obtain the desired layer stack 206 shown in FIG. 2I.

FIGS. 3A-3G illustrate cross-sectional views of an example semiconductor structure 302 during an example process 300 for forming a 3D semiconductor structure, according to certain embodiments. In this example, certain aspects of structure 302 and process 300 may correspond to aspects of structure 202 and process 200 described above with reference to FIGS. 2A-2I and are not repeated.

Figures 3A, 3B:
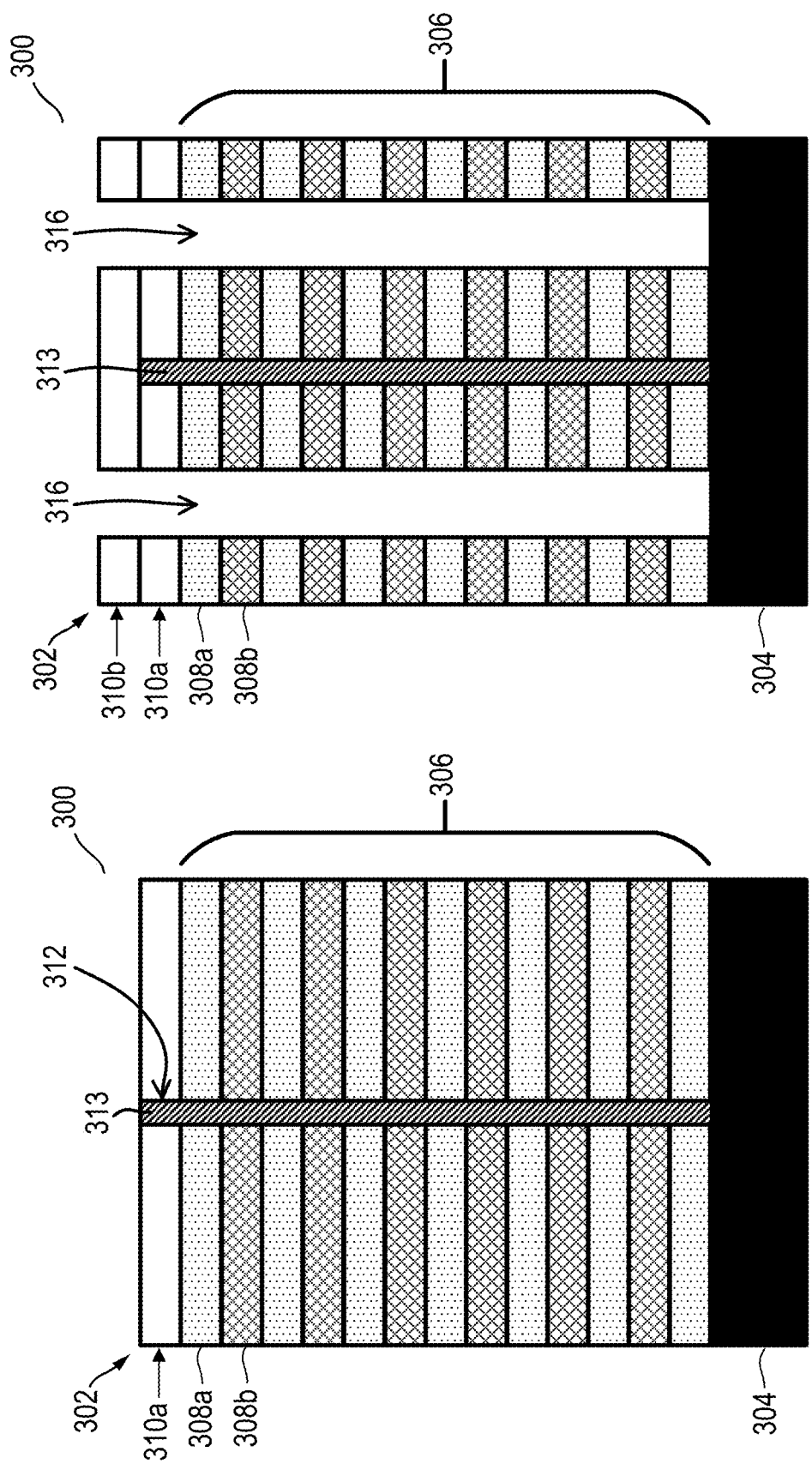

Turning to FIG. 3A, in general structure 302 may correspond to structure 202 in the state shown in FIG. 2C, with structure 302 having been previously processed in a manner similar to that described above with reference to FIGS. 2A-2B. Thus, layer stack 306 of layers 308a and layers 308b may be formed in a similar manner to layer stack 206 of FIG. 2A, with layers 308a and layers 308b being deposited using spin-on coating techniques in a similar manner to that described above with reference to layers 208a and layers 208b of structure 202 in FIG. 2A. Although this disclosure contemplates layers 308a and layers 308b including any of the spin-on materials described herein, in one example, layers 308a include SOG and layers 308b include SOC. Furthermore, structure 302 includes substrate 304 and masking layer 310a, which may be similar to substrate 204 and masking layer 210a, respectively, of structure 202 in FIGS. 2A-2I. In certain embodiments, masking layer 310a is a hardmask, and may include silicon, nitride, metal oxide, or metal.

As shown in FIG. 3A, structure 302 includes a previously-formed opening 312 that has been filled with a fill material 313. Opening 312 may have been formed in layer stack 306 in a manner similar to opening 212 of structure 202, with appropriate masking and etch processes being used according to the materials of layers 308a and 308b. Fill material 313 may be a sacrificial material that is replaced at a later stage of process 300. Although fill material 313 may include any material suitable to serve as a sacrificial material (or dummy material), in certain embodiments, fill material 313 is a metal oxide fill material.

As shown in FIG. 3B, openings 316 are formed in layer stack 306 through layers 308. Opening 316 may be formed in layer stack 306 in a manner similar to openings 216 of structure 202, with appropriate masking and etch processes being used according to the materials of layers 308a and 308b and fill material 313.

Openings 316 may be formed in any suitable manner. In certain embodiments, another masking layer 310b may be deposited on top of layer stack 306 (e.g., on top of masking layer 310a). Masking layer 310b may be used as an etch mask for subsequent etch steps. In certain embodiments, masking layer 310b is resistant to etching in a subsequent etching process for forming openings 316 in layer stack 306. Masking layer 310b may include a material suitable for use in the etch process to be performed, considering selectivity of the etch process being performed. In certain embodiments, masking layer 310b is silicon, SiN (e.g., Si$_3$N$_4$), or a metal hardmask, but masking layer 310b may include any suitable material for use as an etch mask layer. In certain embodiments, masking layer 310b is deposited using an ALD or other CVD deposition process. Masking layer 310b may protect fill material 313 from being etched during formation of openings 316. In certain embodiments, rather than depositing a new masking layer 310b on top of masking layer 310a, masking layer 310a may be removed and masking layer 310b may replace masking layer 310a.

As shown in FIG. 3C, layers 308 of a particular type of material are removed from layer stack 306, which may be generally analogous to the removal process shown and described above with reference to FIG. 2E, the details of which are incorporated by reference. In the illustrated example, layers 308a, accessible via openings 316, are removed from layer stack 306. As described above, in one example layers 308a are SOG and layers 308b are SOC. Thus, in one example, the SOG (layers 308a) may be removed. In addition to voids created by openings 316, removing layers 308a leaves voids 318 within layer stack 306 where layers 308a were previously located.

This disclosure contemplates using any suitable etch process to remove layers 308a. A suitable etch process may include an etch process that is selective to etching the layers being removed (e.g., layers 308a in this example) relative to the layers not being removed (e.g., layers 308b in this example). Again referring to an example in which layers 308a are SOG and layers 308b are SOC, with layers 308a (SOG) being removed, a suitable etch process might include DHF acid or vapor phase or plasma etch.

As illustrated in FIG. 3D, removed layers 308a may be replaced with another material (shown as layers 308c). Layers 308c may be formed in any suitable manner. Layers 308c may include any suitable material, such as SiO$_2$, SiN, SiON, SiC, SiOC, and/or metal oxides. As just one example, continuing with the example in which layers 308b are SOC, the material of layers 308c could be oxide (e.g., SiO$_2$). In certain embodiments, the material of layers 308c is an insulating material. Layers 308c may be formed in a manner similar to that described above with reference to forming layers 208c (in FIGS. 2F-2G), including using an ALD or other CVD process, the details of which are incorporated by reference.

As illustrated in FIG. 3E, layers 308b are removed from layer stack 306. As described above, in one example layers 308b are SOC. Thus, in one example, the SOC (layers 308b) may be removed. In addition to voids created by openings 316, removing layers 308b leaves voids 319 within layer stack 306 where layers 308b were previously located.

This disclosure contemplates using any suitable etch process to remove layers 308b. A suitable etch process may include an etch process that is selective to etching layers 308b relative to layers 308c. Again referring to an example in which layers 308b are SOC and layers 308c are oxide, with layers 308b (SOC) being removed, a suitable etch process might include DHF acid or vapor phase or plasma etch. This may remove all layers 308b from layer stack 306.

As illustrated in FIG. 3F, open spaces of layer stack 306 may be filled with a material 320. For example, voids 319 (previously occupied by layers 308b) may be filled with material 320 and openings 316 also may be filled with material 320. Material 320 may be a metal-containing material appropriate for the corresponding fabrication process, such as for forming a 3D semiconductor structure (e.g., a 3D VNAND device). Material 320 may be generally analogous to material 220 described above with reference to FIG. 2I, the details of which are incorporated by reference. Thus, in certain embodiments, in the state illustrated in FIG. 3F (as well as in FIG. 3G, described below), layer stack 306 includes alternating oxide layers and nitride layers, making layer stack 306 an ONON stack. Other stack types are possible, such as an OPOP stack for example.

As shown in FIG. 3G, fill material 313 in openings 312 may be removed and replaced with a channel material 314. Fill material 313 may be removed from the area of openings 312 to re-form openings 312 (to be subsequently re-filled with channel material 314). For example, fill material 313 may be removed using any suitable etch process, such as one or more wet etch processes, plasma etch processes, RIE processes, or combinations of these or other etch processes. If appropriate, masking layer 310a may be patterned (e.g., potentially using the same etch mask used to form openings 312 in a prior step) to facilitate the etch process. Channel material 314 may be generally analogous to channel material 214 described above with reference to process 200, the details of which are incorporated by reference, including example materials and deposition processes. As an example, channel material 314 may include multiple material layers that include silicon, oxide, SiN, oxide, and silicon (e.g., SONOS structures).

In the example illustrated in FIG. 3G, masking layer 310b and a top portion of material 320 in openings 316 may be removed, exposing fill material 313 at the top of structure 302 for replacement of fill material 313 with channel material 314. This disclosure contemplates other implementations. For example, masking layer 310b in of FIG. 3F may be patterned to expose fill material 313 in opening 312, such that fill material 313 can be removed and replaced with channel material 314.

FIGS. 4A-4E illustrate cross-sectional views of an example semiconductor structure 402 during an example process 400 for forming a 3D semiconductor structure, according to certain embodiments. In this example, certain aspects of structure 402 and process 400 may correspond to aspects of structure 302 and process 300 described above with reference to FIGS. 3A-3G and are not repeated. In certain embodiments, process 400 may be generally analogous to process 300 with certain differences, including a reversal of layers of layer stack 306 (including which is the first to be removed and replaced) and the use of a nitride layer in place of an oxide layer for layer 408c. Other differences to the executed deposition and etch processes may be applicable to accommodate the modified arrangement and materials.

Turning to FIG. 4A, in general structure 402 may correspond to structure 302 in the state shown in FIG. 3A, with structure 402 having been previously processed in a manner similar to that described above with reference to FIGS. 2A-2B (as was the case with layer stack 306 in the state shown in FIG. 3A). Thus, layer stack 406 of layers 408a and layers 408b may be formed in a similar manner to layer stack 306, with layers 408a and layers 408b being deposited using spin-on coating techniques in a similar manner to that described above with reference to layers 208a and layers 208b of structure 202 in FIG. 2A. Although this disclosure contemplates layers 308a and layers 308b including any of the spin-on materials described herein, in one example, layers 408a include SOG and layers 408b include SOC, which in some implementations may be the reverse order of the layers 308a and 308b of structure 302 in FIG. 3A. Furthermore, structure 402 includes substrate 404 and masking layer 410a, which may be similar to substrate 304 and masking layer 310a, respectively, of structure 302 in FIGS. 3A-3G. In certain embodiments, masking layer 410a is a hardmask, and may include silicon, nitride, metal oxide, or metal.

As shown in FIG. 4A, structure 402 includes a previously-formed opening 412, which in the state shown in FIG. 4A, has been filled with a fill material 413. Opening 412 may have been formed in layer stack 306 in a manner similar to opening 312 of structure 302, with appropriate masking and etch processes being used according to the materials of layers 408a and 408b. Fill material 413 may be a sacrificial material that is replaced at a later stage of process 400. Although fill material 413 may include any material suitable to serve as a sacrificial material (or dummy material), in certain embodiments, fill material 313 is a metal oxide fill material.

Figure 4C:
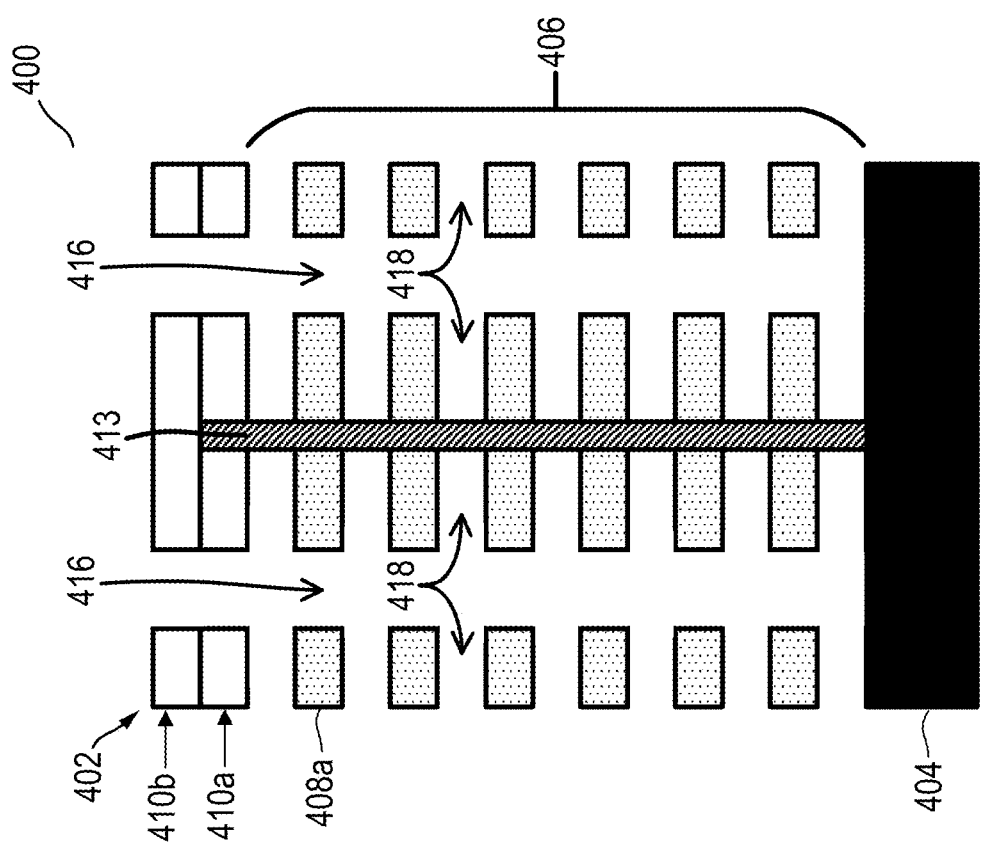
Figure 4B:
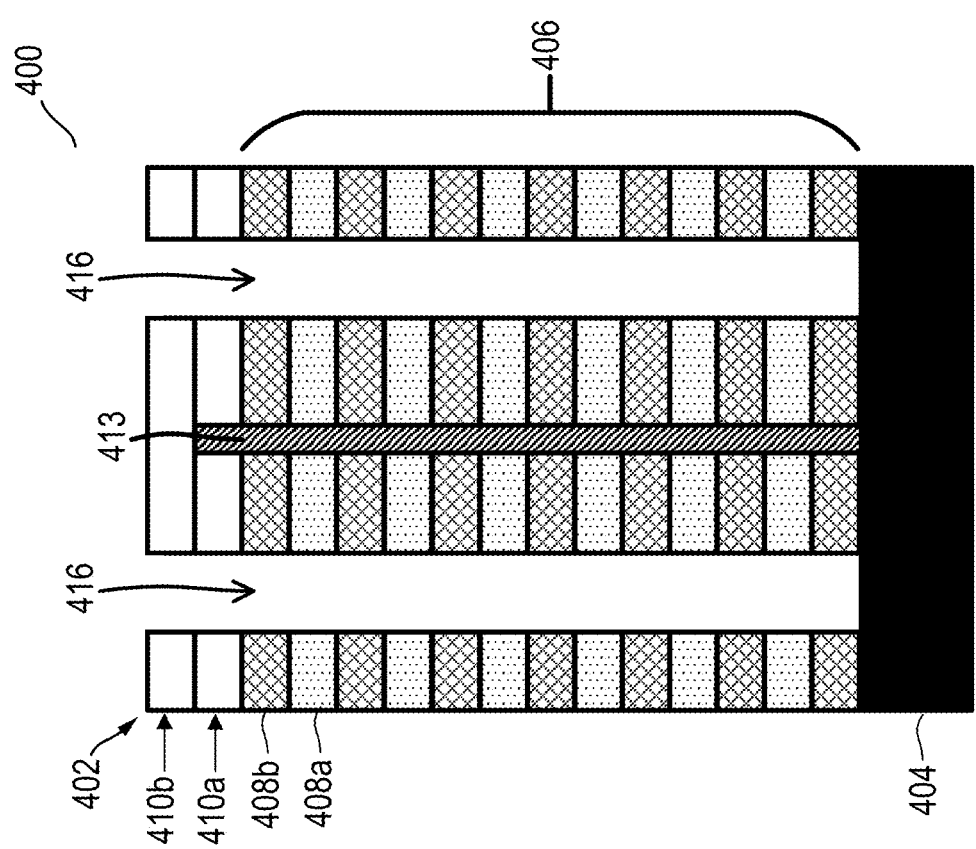

As shown in FIG. 4B, openings 416 are formed in layer stack 406 through layers 408. Opening 416 may be formed in layer stack 406 in a manner similar to openings 316 of structure 302, with appropriate masking and etch processes being used according to the materials of layers 408a and 408b and fill material 413. In certain embodiments, a second masking layer 410b may be deposited on masking layer 410a and patterned for forming openings 416 while protecting fill material 413 from being etched. Masking layer 410b may be similar to masking layer 310b of structure 302 in FIGS. 3B-3F. In certain embodiments, rather than depositing a new masking layer 410b on top of masking layer 410a, masking layer 410a may be removed and masking layer 410b may replace masking layer 410a.

As shown in FIG. 4C, layers 408 of a particular type of material are removed from layer stack 406, which may be generally analogous to the removal process shown and described above with reference to FIGS. 2E and 3C, the details of which are incorporated by reference. In the illustrated example, layers 408b, accessible via openings 416, are removed from layer stack 406. As described above, in one example layers 408b are SOC and layers 408a are SOG. Thus, in one example, the SOC (layers 408b) may be removed. In addition to voids created by openings 416, removing layers 408b leaves voids 418 within layer stack 406 where layers 408b were previously located.

This disclosure contemplates using any suitable etch process to remove layers 408b. A suitable etch process may include an etch process that is selective to etching the layers being removed (e.g., layers 408b in this example) relative to the layers not being removed (e.g., layers 408a in this example). Again referring to an example in which layers 408a are SOG and layers 408b are SOC, with layers 408b (SOC) being removed, a suitable etch process might include DHF acid or vapor phase or plasma etch.

Figure 4E:
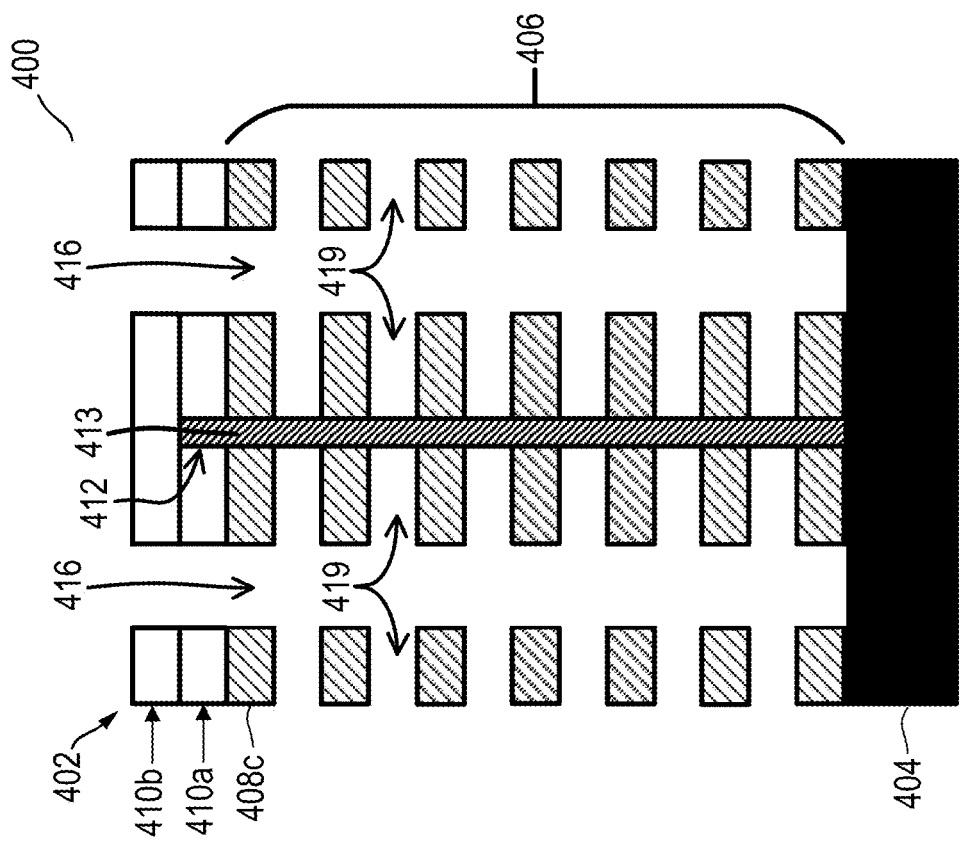
Figure 4D:
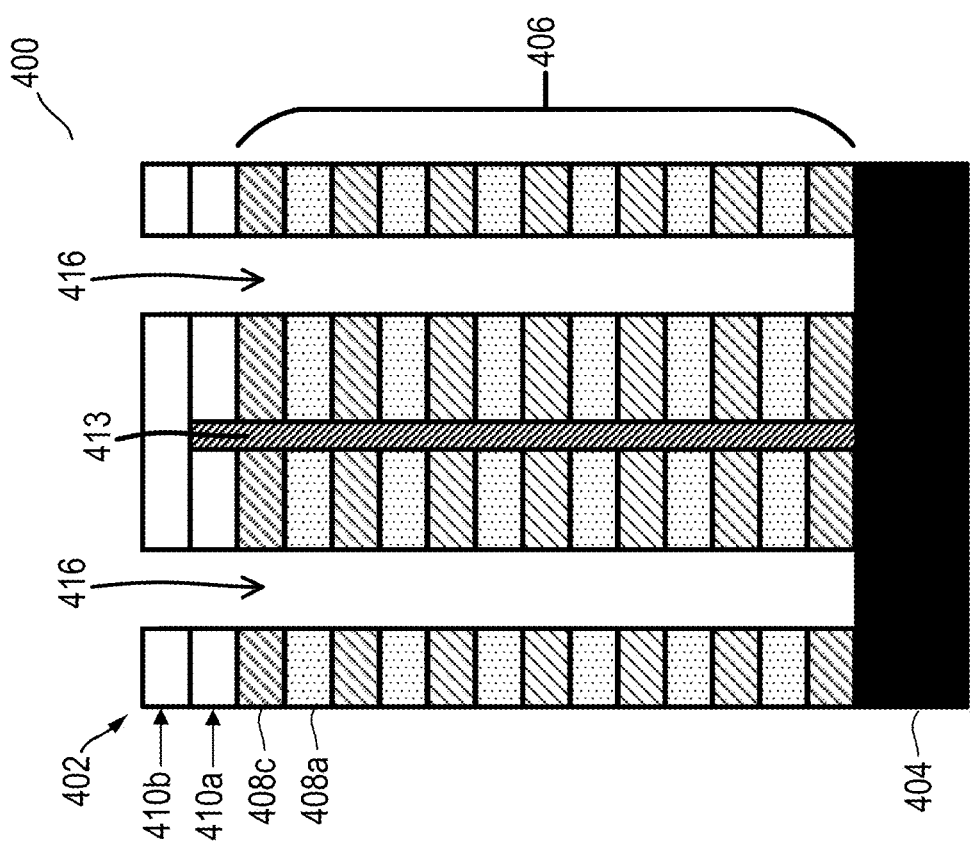

As illustrated in FIG. 4D, removed layers 408b may be replaced with another material (shown as layers 408c). Layers 408c may be formed in any suitable manner. Layers 408c may include any suitable material, such as $SiO_2$, SiN, SiON, SiC, SiOC, and/or metal oxides. As just one example, continuing with the example in which layers 408a are SOG, the material of layers 408c could be nitride (e.g., SiN). In certain embodiments, the material of layers 408c is an insulating material. Layers 408c may be formed in a manner similar to that described above with reference to forming layers 308c (in FIG. 3D), including using an ALD or other CVD process, the details of which are incorporated by reference.

As illustrated in FIG. 4E, layers 408a are removed from layer stack 406. As described above, in one example layers 408a are SOG. Thus, in one example, the SOG (layers 408a) may be removed. In addition to voids created by openings 416, removing layers 408a leaves voids 419 within layer stack 406 where layers 408a were previously located.

This disclosure contemplates using any suitable etch process to remove layers 408a. A suitable etch process may include an etch process that is selective to etching layers 408a relative to layers 408c. Again referring to an example in which layers 408a are SOG and layers 408c are nitride, with layers 408a (SOG) being removed, a suitable etch process might include DHF acid or vapor phase or plasma etch. This may remove all layers 408a from layer stack 406.

For the sake of conciseness, additional steps of process 400 and associated processing of structure 402 are not illustrated or described, but may generally follow the processing of structure 302 shown in, and described with reference to, FIGS. 3F and 3G, the details of which are incorporated by reference. To that end, voids 419 and openings 416 may be filled with a suitable conductive material, such as a suitable metal-containing material, as described above with reference to FIG. 3F. Furthermore, fill material 413 in openings 412 may be removed and replaced with a suitable channel material, as described above with reference to FIG. 3G.

FIGS. 5A-5E illustrate cross-sectional views of an example semiconductor structure 502 during an example process 500 for forming a 3D semiconductor structure, according to certain embodiments. In this example, certain aspects of structure 502 and process 500 may correspond to aspects of structure 302 and process 300 described above with reference to FIGS. 3A-3G and are not repeated. In particular, rather than proceeding from FIG. 3E to FIG. 3F, FIG. 5A may follow FIG. 3E, with layers 508c of layer stack 506 in FIG. 5A corresponding to layers 308c of layer stack 306 in FIG. 3E.

Figures 5A, 5B:
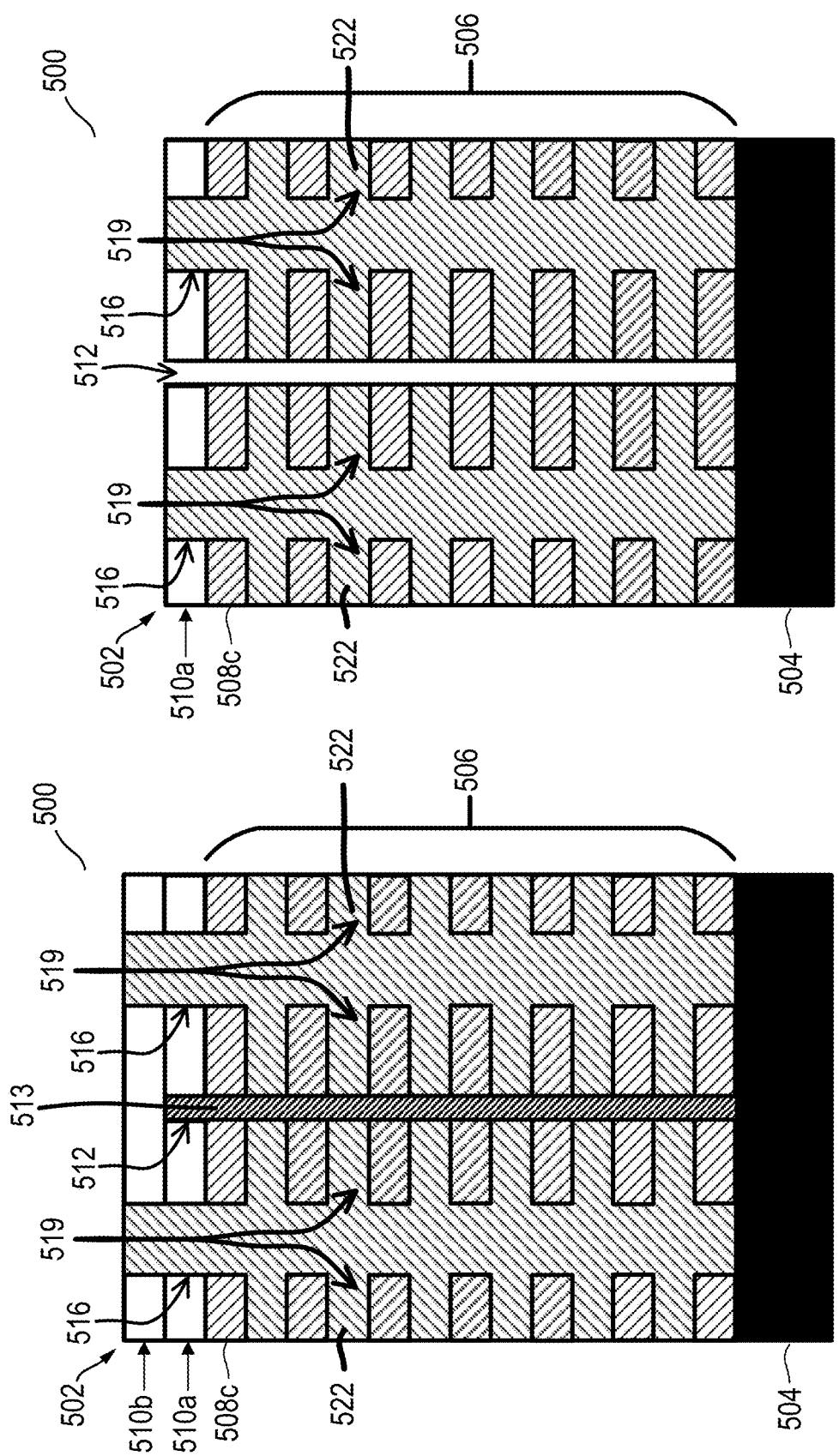

Turning to FIG. 5A, in part structure 502 may correspond to structure 302 in the state shown in FIG. 3E, with structure 502 having been previously processed in a manner similar to that described above with reference to structure 302 of FIGS. 3A-3E. Thus, layer stack 506 of layers 508c may have been formed in a similar manner to layer stack 306 of FIG. 3E, with layer 508c corresponding to layer 308c. In certain embodiments, layer 508c may be an oxide (e.g., $SiO_2$) or nitride (e.g., SiN). In certain embodiments, the material of layers 508c is an insulating material. Furthermore, structure 502 includes substrate 504, masking layer 510a, and masking layer 510b, which may be similar to substrate 304, masking layer 310a, and masking layer 310b, respectively, of structure 302 in FIGS. 3A-3G. In certain embodiments, masking layer 510a and/or masking layer 510b are hardmasks, and may include silicon, nitride, metal oxide, or metal.

Additionally, structure 502 includes a previously-formed opening 512, which in the state shown in FIG. 5A, has been filled with a fill material 513. Opening 512 may have been formed in layer stack 506 in a manner similar to opening 312 of structure 302, with appropriate masking and etch processes being used according to the materials of initial layers of a layer stack 506 (which may be have been similar to layers 308a and layers 308b of FIG. 3A). Fill material 513 may be a sacrificial material that is replaced at a later stage of process 500. Although fill material 513 may include any material suitable to serve as a sacrificial material (or dummy material), in certain embodiments, fill material 513 is a metal oxide fill material.

Additionally, structure 502 includes previously-formed openings 516 and voids 519, which in the state shown in FIG. 5A, has been filled with a fill material 522. Openings 516 and voids 519 may have been formed in layer stack 506 in a manner similar to openings 316 and voids 319, respectively, of structure 302 (e.g., in FIG. 3E), with appropriate masking and etch processes being used according to the materials of initial layers of a layer stack 506 (which may have been similar to layers 308b and layers 308c of FIG. 3D). In certain embodiments, masking layer 510b may protect fill material 513 from being etched during formation of openings 516 and/or voids 519.

Fill material 522 may be a sacrificial material that is replaced at a later stage of process 500. Although fill material 522 may include any material suitable to serve as a sacrificial material (or dummy material), in certain embodiments, fill material 522 is a nitride material, such as SiN. Fill material 522 may deposited in any suitable manner, including using an ALD or other CVD process.

As shown in FIG. 5B, fill material 513 may be removed from the area of openings 512 to re-form openings 512 (to be subsequently re-filled with channel material). For example, fill material 513 may be removed using any suitable etch process, such as one or more wet etch processes, plasma etch processes, RIE processes, or combinations of these or other etch processes. If appropriate, masking layer 510a may be patterned (e.g., potentially using the same etch mask used to form openings 512 in a prior step) to facilitate the etch process. In the example illustrated in FIG. 5B, masking layer 510b and a top portion of material 522 in openings 516 may be removed, exposing fill material 513 at the top of structure 502 for replacement of fill material 513 with channel material 514 (as described below with reference to FIG. 5C). This disclosure contemplates other implementations. For example, masking layer 510b in FIG. 5A may be patterned to expose fill material 513 in opening 512, such that fill material 513 can be removed and replaced with channel material 514 (as described below with reference to FIG. 5C). The etch process used to remove fill material 513 may be adequately selective to removing fill material 513 (with minimal or no removal of fill material 522) such that use of another masking layer 510 for protecting fill material 522 may be avoided, if desired.

As shown in FIG. 5C, openings 512 may be filled with a channel material 514. In the case of a 3D memory device, channel material 514 may include any material(s) suitable for use as a channel (or portion of a channel) of the 3D memory device. Channel material 514 may be generally analogous to channel material 314 described above with reference to process 300, the details of which are incorporated by reference, including example materials and deposition processes. As just one example, channel material 514 may include multiple material layers that include silicon, oxide, SiN, oxide, and silicon (e.g., SONOS structures).

As shown in FIG. 5D, fill material 522 may be removed from structure 502, re-forming openings 516 and voids 519. Fill material 522 may be removed from structure 502 using any suitable etch process, such as one or more wet etch processes, plasma etch processes, RIE processes, or combinations of these or other etch processes. If appropriate, masking layer 510a may be patterned (e.g., potentially using the same etch mask used to form openings 516 in a prior step) to facilitate the etch process. In certain embodiments, another masking layer 510 may be deposited (e.g., over masking layer 510a) to protect channel material 514 from removal during removal of fill material 522. Additionally or alternatively, the etch process used to remove fill material 522 may be adequately selective to removing fill material 522 (with minimal or no removal of channel material 514) such that use of another masking layer 510 for protecting channel material 514 may be avoided, if desired. As described above, in one example, fill material 522 is a nitride material (e.g., SiN), and may be removed using a process that is suitably selective to removing the nitride relative to other materials of structure 502.

Figure 5E:
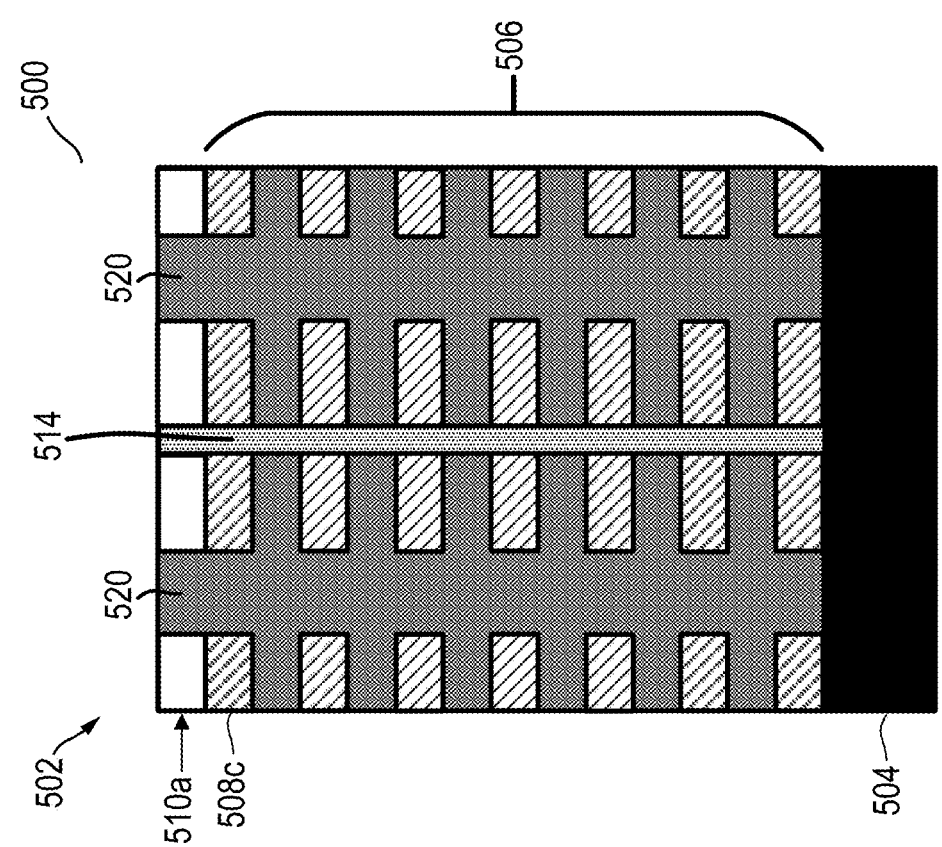

As shown in FIG. 5E, open spaces of layer stack 506 may be filled with a material 520. For example, voids 519 (previously occupied by fill material 522) may be filled with material 520 and openings 516 also may be filled with material 520. Material 520 may be a metal-containing material appropriate for the corresponding fabrication process, such as for forming a 3D semiconductor structure (e.g., a 3D VNAND device). Material 520 may be generally analogous to material 320 described above with reference to FIG. 3F, the details of which are incorporated by reference. Thus, in certain embodiments, in the state illustrated in FIG. 5E, layer stack 506 includes alternating oxide layers and nitride layers, making layer stack 506 an ONON stack. Other stack types are possible, such as an OPOP stack for example.

FIGS. 6A-6G illustrate cross-sectional views of an example semiconductor structure 602 during an example process 600 for forming a 3D semiconductor structure, according to certain embodiments. In this example, certain aspects of structure 602 and process 600 may correspond to aspects of structure 502 and process 500 described above with reference to FIGS. 5A-5E and are not repeated. In particular, rather than proceeding from FIG. 5A to FIG. 5B, FIG. 6A may follow FIG. 5A, with layers 608c of layer stack 606 in FIG. 6A corresponding to layers 508c of layer stack 506 in FIG. 5A.

Figure 6A:
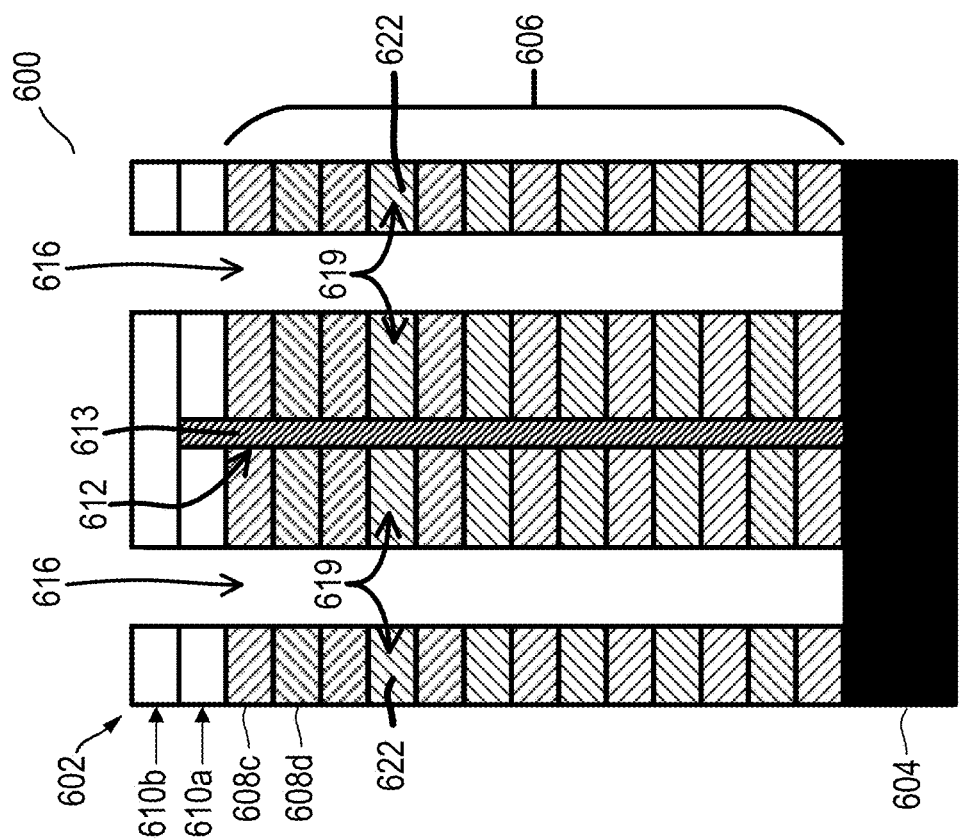
FIGS. 6A-6G illustrate cross-sectional and plan views of an example semiconductor structure during an example process for forming a 3D semiconductor structure, according to certain embodiments.

Turning to FIG. 6A, in part structure 602 may correspond to structure 502 in the state shown in FIG. 5A, with structure 602 having been previously processed in a manner similar to that described above with reference to structure 502 of FIG. 5A. Thus, layer stack 606 of layers 608c may have been formed in a similar manner to layer stack 506 of FIG. 5A, with layer 608c corresponding to layer 508c. In certain embodiments, layer 608c may be an oxide (e.g., $SiO_2$) or a nitride (e.g., SiN). In certain embodiments, the material of layer 608c is an insulating material. Furthermore, structure 602 includes substrate 604, masking layer 610a, and masking layer 610b, which may be similar to substrate 504, masking layer 510a, and masking layer 510b, respectively, of structure 502 in FIG. 5A. In certain embodiments, masking layers 610 are hardmasks, and may include silicon, nitride, metal oxide, or metal.

Additionally, structure 602 includes a previously-formed opening 612, which in the state shown in FIG. 6A, has been filled with a fill material 613. Opening 612 may have been formed in layer stack 606 in a manner similar to opening 312 of structure 302, with appropriate masking and etch processes being used according to the materials of initial layers of a layer stack 606 (which may be have been similar to layers 308a and layers 308b of FIG. 3A). Fill material 613 may be a sacrificial material that is replaced at a later stage of process 600. Although fill material 613 may include any material suitable to serve as a sacrificial material (or dummy material), in certain embodiments, fill material 613 is a metal oxide fill material. In certain embodiments, masking layer 610b may protect fill material 613 from being etched during formation of openings 616 and/or voids 619.

As shown in FIG. 6A, layer stack 606 also includes layers 608d, which may occupy previously-formed voids 619. Layers 608d may include fill material 622, which may correspond to fill material 522 of FIG. 5A, the details of which are incorporated by reference. Voids 619 may have been formed in layer stack 606 in a manner similar to voids 519 of structure 502 (e.g., in FIG. 5A), with appropriate masking and etch processes being used according to the materials of initial layers of a layer stack 606 (which may have been similar to layers 308b and layers 308c of FIG. 3D).

Fill material 622 may previously have occupied both openings 616 and voids 619 of layer stack 606, similar to the manner in which fill material 522 of layer stack 506 occupies both openings 516 and voids 519 of layer stack 506 as shown in FIG. 5A. Layers 608d may be formed by etching fill material 622 of layer stack 606 to re-form openings 616 in layer stack 606. That is, fill material 622 may be removed from the area of openings 616 to re-form openings 616, exposing the materials of layers 608c (as well as layers 608d) within openings 616. For example, fill material 622 may be removed using any suitable etch process, such as one or more wet etch processes, plasma etch processes, RIE processes, or combinations of these or other etch processes. If appropriate, masking layer 610 may be patterned (e.g., potentially using the same etch mask used to form openings 616 in a prior step) to facilitate the etch process.

Figure 6B:
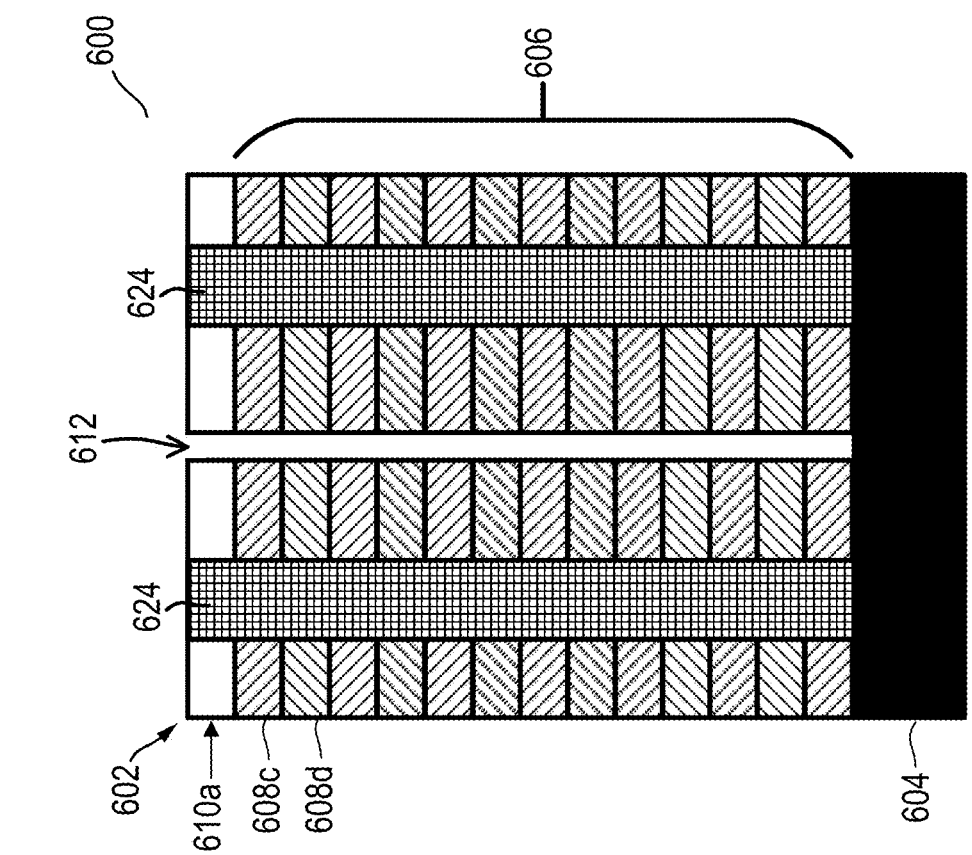

As shown in FIG. 6B, a fill material 624 is deposited in openings 616. Fill material 624 may be a sacrificial material that is replaced at a later stage of process 600. Although fill material 624 may include any material suitable to serve as a sacrificial material (or dummy material), in certain embodiments, fill material 624 is a metal oxide fill material, which might or might not be the same metal oxide fill material used as fill material 613 (in a case in which fill material 613 is a metal oxide). Fill material 624 may be deposited in openings 616 using any suitable deposition process. For example, fill material 624 may be deposited using one or more of a CVD process (including, potentially, an ALD process), a PECVD process, a PVD process, a PEPVD process.

Figure 6C:
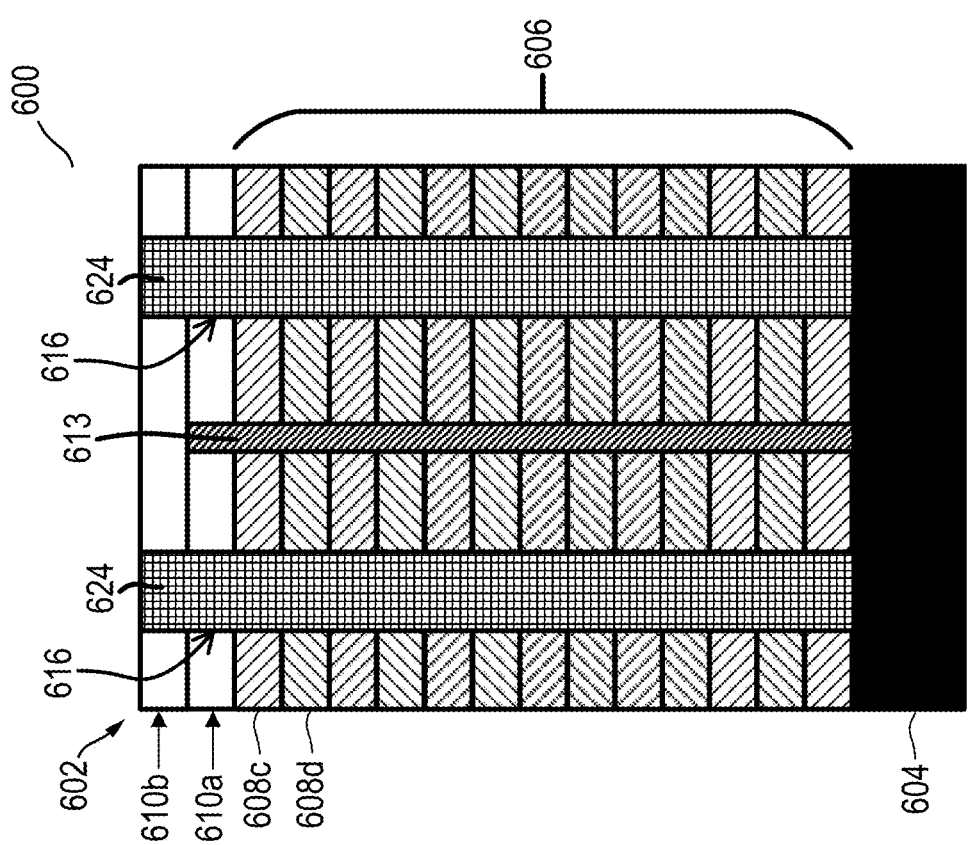

As shown in FIG. 6C, fill material 613 may be removed from the area of openings 612 to re-form openings 612 (to be subsequently re-filled with channel material). For example, fill material 613 may be removed using any suitable etch process, such as one or more wet etch processes, plasma etch processes, RIE processes, or combinations of these or other etch processes. If appropriate, masking layer 610a may be patterned (e.g., potentially using the same etch mask used to form openings 612 in a prior step) to facilitate the etch process. In the example illustrated in FIG. 6C, masking layer 610b and a top portion of material 624 in openings 616 may be removed, exposing fill material 613 at the top of structure 602 for replacement of fill material 613 with channel material 614 (as described below with reference to FIG. 6D). This disclosure contemplates other implementations. For example, masking layer 610b in FIG. 6B may be patterned to expose fill material 613 in opening 612, such that fill material 613 can be removed and replaced with channel material 614 (as described below with reference to FIG. 6D). The etch process used to remove fill material 613 may be adequately selective to removing fill material 613 (with minimal or no removal of fill material 624) such that use of another masking layer 610 for protecting fill material 624 may be avoided, if desired.

Figure 6E:
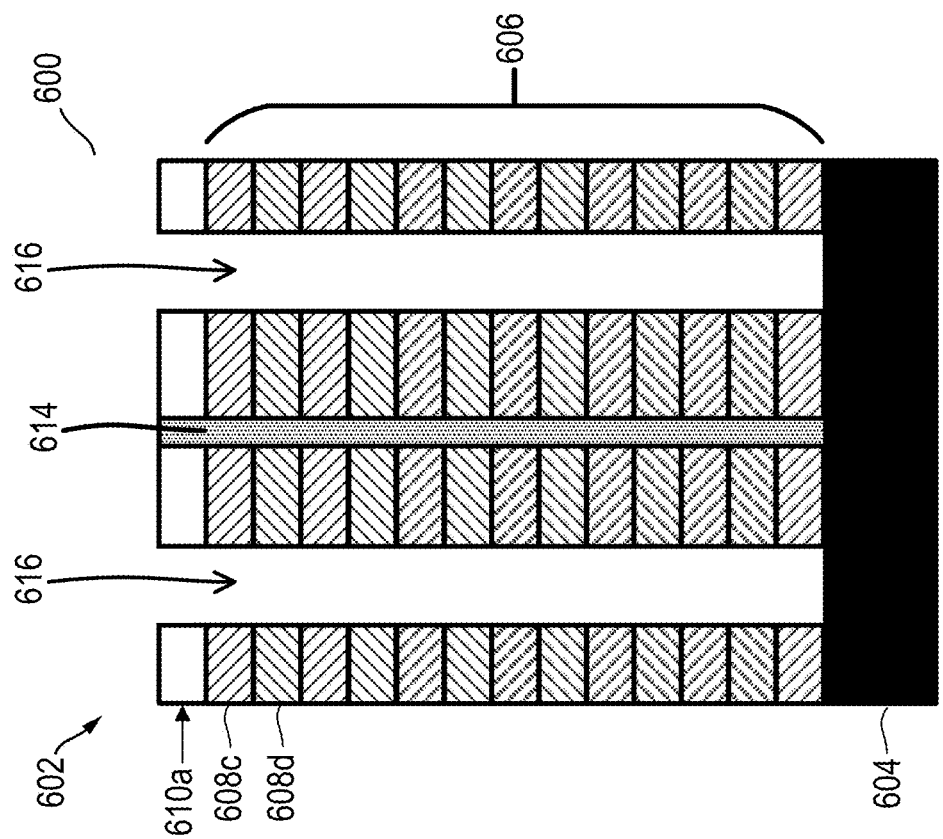
Figure 6D:
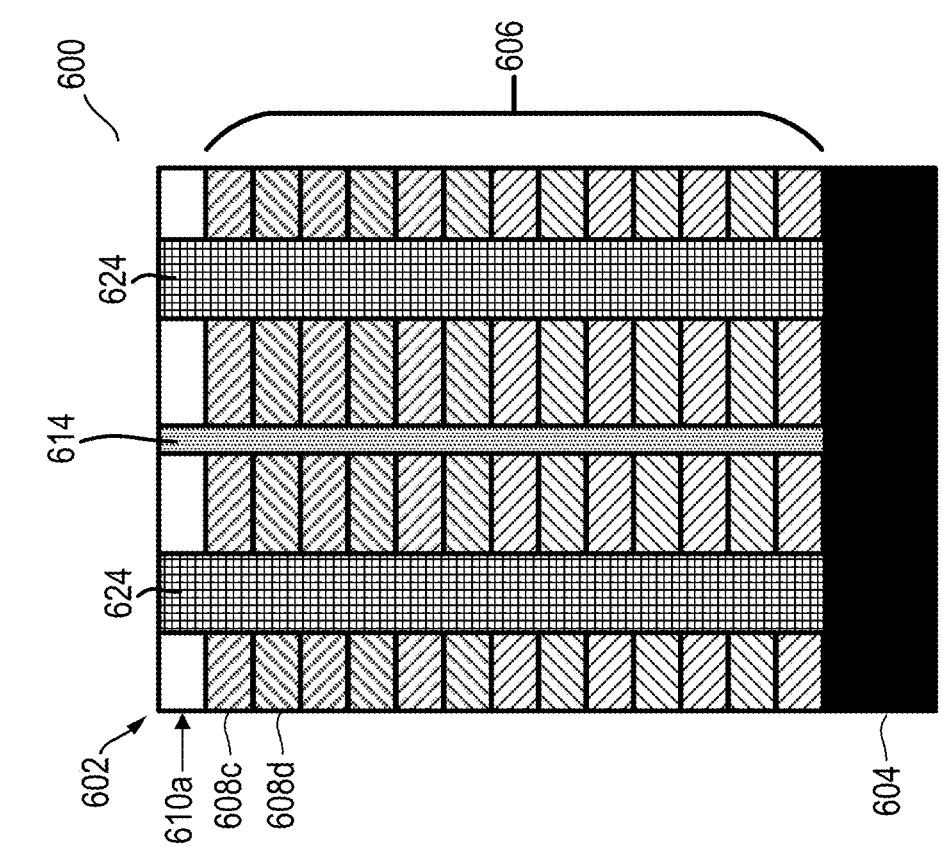

As shown in FIG. 6D, openings 612 may be filled with a channel material 614. In the case of a 3D memory device, channel material 614 may include any material(s) suitable for use as a channel (or portion of a channel) of the 3D memory device. Channel material 614 may be generally analogous to channel material 514 described above with reference to process 500 and the details of which are incorporated by reference, including example materials and deposition processes. As just one example, channel material 614 may include multiple material layers that include silicon, oxide, SiN, oxide, and silicon (e.g., SONOS structures).

As shown in FIG. 6E, fill material 624 may be removed from structure 602, re-forming openings 616 and exposing the materials of layers 608c and layers 608d within openings 616. For example, fill material 624 may be removed using any suitable etch process, such as one or more wet etch processes, plasma etch processes, RIE processes, or combinations of these or other etch processes. If appropriate, masking layer 610a may be patterned (e.g., potentially using the same etch mask used to form openings 616 in a prior step) to facilitate the etch process. In certain embodiments, another masking layer 610 may be deposited (e.g., over masking layer 610a) to protect channel material 614 from removal during removal of fill material 624. Additionally or alternatively, the etch process used to remove fill material 624 may be adequately selective to removing fill material 624 (with minimal or no removal of channel material 614)

such that use of another masking layer 610 for protecting channel material 614 may be avoided, if desired.

Figure 6G:
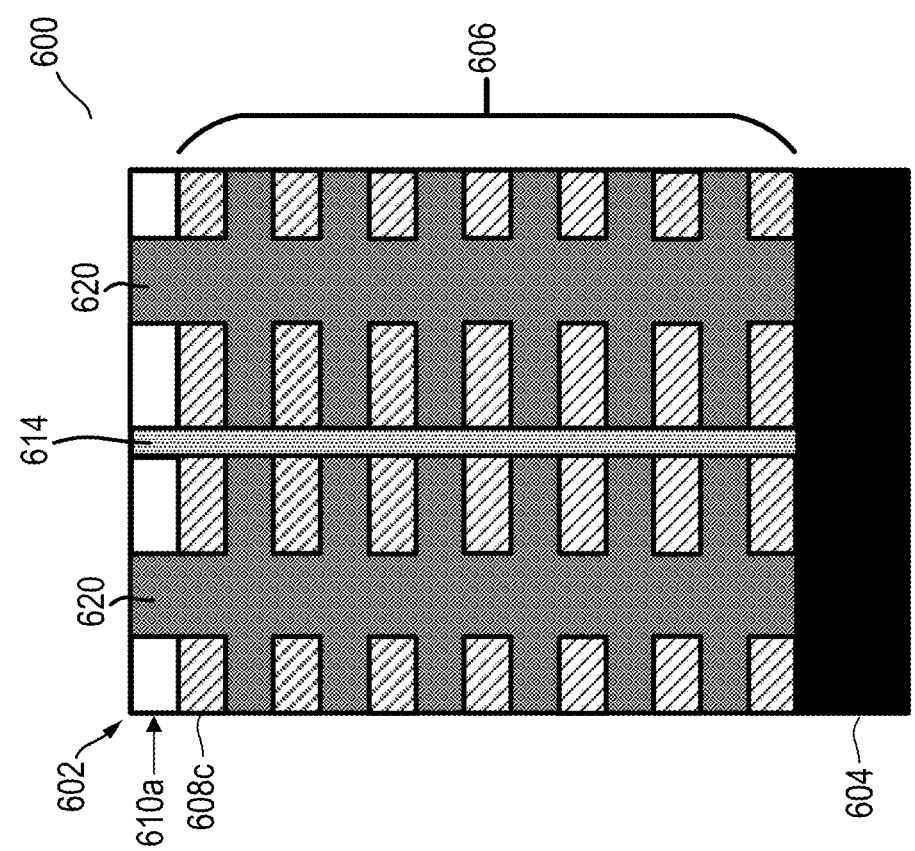
Figure 6F:
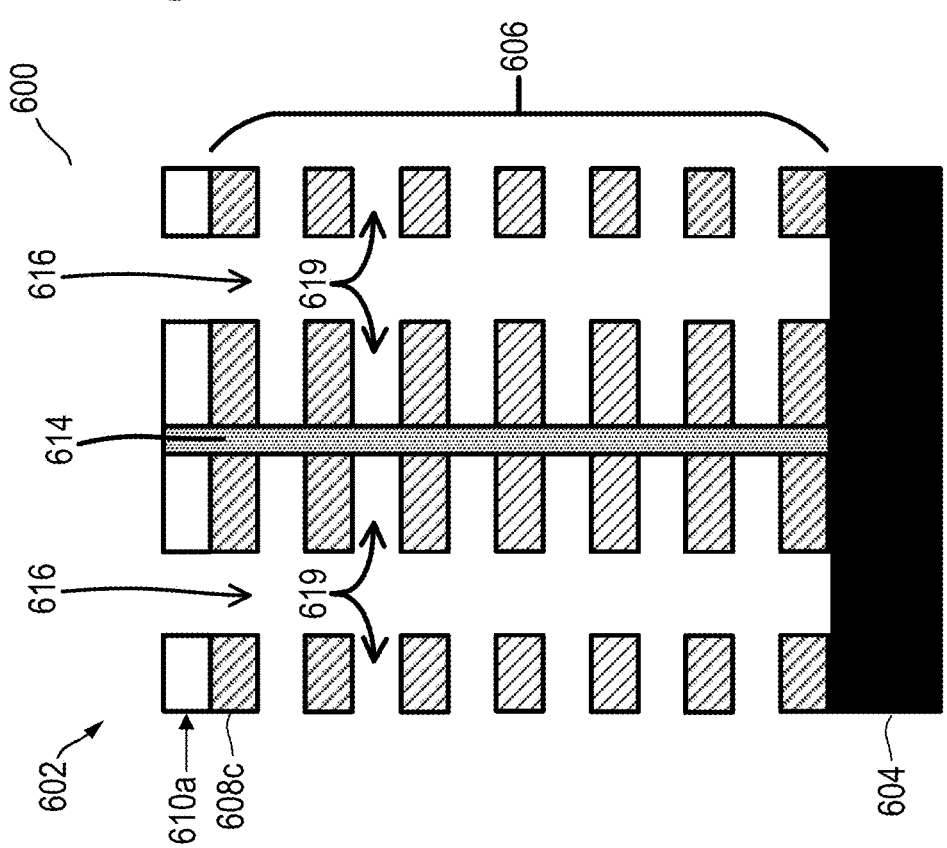

As shown in FIG. 6F, layers 608d (fill material 622) may be removed from structure 602, re-forming voids 619. Fill material 622 may be removed from structure 602 using any suitable etch process, such as one or more wet etch processes, plasma etch processes, RIE processes, or combinations of these or other etch processes. If appropriate, masking layer 610 may be patterned (e.g., potentially using the same etch mask used to form openings 616 in a prior step) to facilitate the etch process. As described above, in one example, fill material 622 is a nitride material (e.g., SiN), and may be removed using a process that is suitably selective to removing the nitride relative to other materials of structure 602.

As shown in FIG. 6G, open spaces of layer stack 606 may be filled with a material 620. For example, voids 619 (previously occupied by fill material 522) may be filled with material 620 and openings 616 also may be filled with material 620. Material 620 may be a metal-containing material appropriate for the corresponding fabrication process, such as for forming a 3D semiconductor structure (e.g., a 3D VNAND device). Material 620 may be generally analogous to material 520 described above with reference to FIG. 5E, the details of which are incorporated by reference. Thus, in certain embodiments, in the state illustrated in FIG. 6G, layer stack 606 includes alternating oxide layers and nitride layers, making layer stack 606 an ONON stack. Other stack types are possible, such as an OPOP stack for example.

Figure 7:
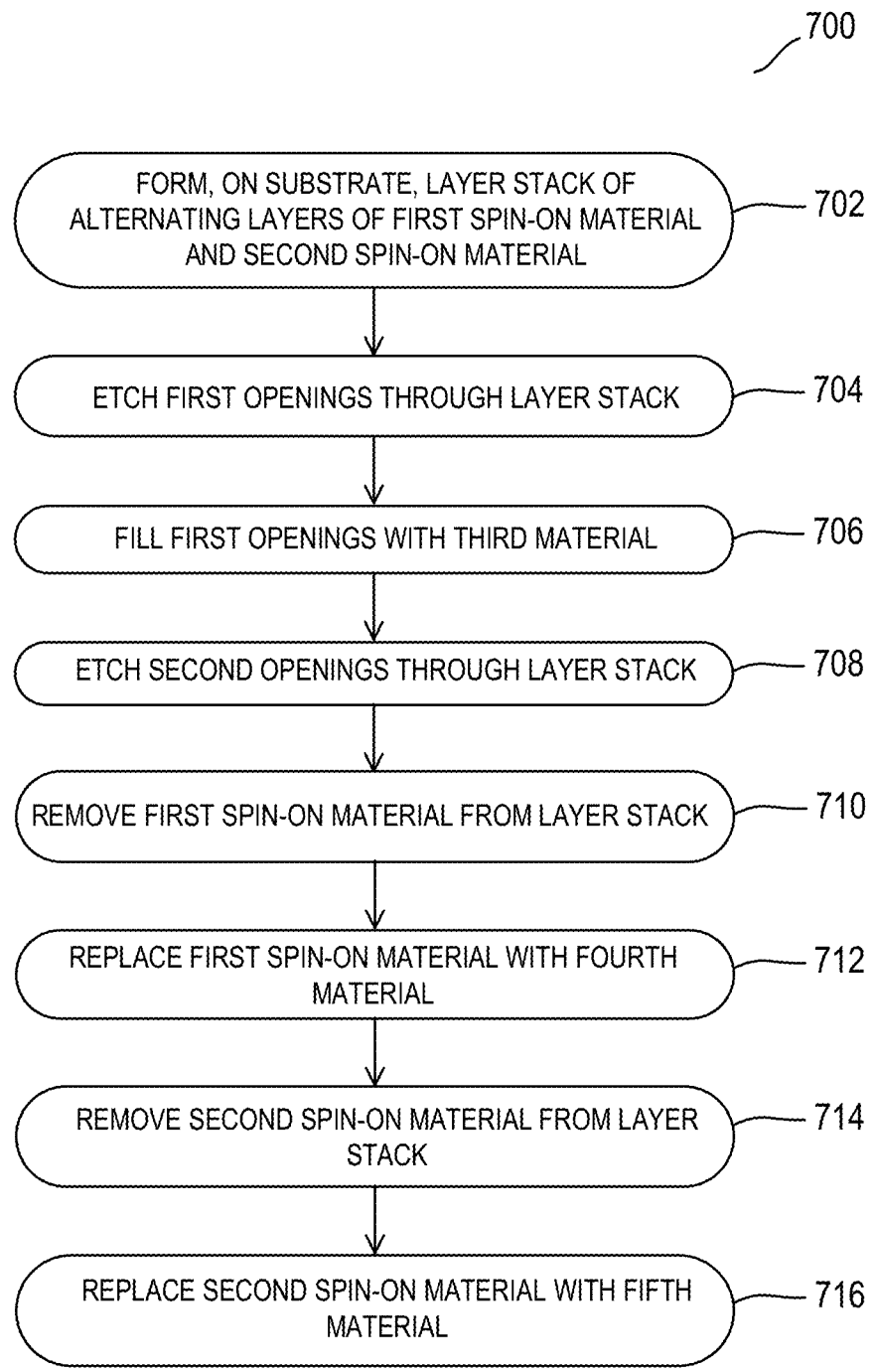
FIG. 7 illustrates a flow diagram of an example method for forming 3D semiconductor structures, according to certain embodiments.

FIG. 7 illustrates a flow diagram of an example method 700 for forming 3D semiconductor structures, according to certain embodiments. At step 702, a layer stack of alternating layers of first spin-on material and second spin-on material may be formed. The first spin-on material layers and the second spin-on materials layers may be formed by spin-on deposition. For example, the layer stack may correspond to an initial state of layers stacks 206, 306, 406, 506, or 606 of structures 202, 302, 402, 502, or 602, respectively. In certain embodiments, the first spin-on material and the second spin-on material each comprises SOG, SOC, SiOC, ODL, OPL, SOH, metal oxide, SiON, SiOCN, SiN, SiC, photoresist, BARC, DBARC, or photosensitive film material. The first spin-on material and the second spin-on material may be different materials such that at least one of the first spin-on material or the second spin-on material can be selectively etched relative to the other of the first spin-on material or the second spin-on material, or relative to another material of the structure being processed.

At step 704, first openings may be etched through the layer stack. For example, the first openings may correspond to openings 212, 312, 412, 512, or 612 of structures 202, 302, 402, 502, or 602, respectively. The first openings may be channel openings.

At step 706, the first openings may be filled with a third material. In certain embodiments, the third material may be a material or combination of materials suitable for use in a channel of a 3D memory device or other 3D semiconductor device. For example, the third material may be a channel material, such as channel materials 214, 314, 414, 514, or 614 of structures 202, 302, 402, 502, or 602, respectively. As a particular example of a channel material, the channel material may include one or more of $SiO_2$, SiN, and polysilicon. In certain embodiments, the third material may be a fill material to be later replaced by a channel material (e.g., between steps 712 and 714 or after step 716). For example, the fill material may be fill material 313, 413, 513, or 613 of structures 302, 402, 502, or 602, respectively.

At step 708, second openings may be etched through the layer stack. For example, the second openings may correspond to openings 216, 316, 416, 516, or 616 of structures 202, 302, 402, 502, or 602, respectively. The second openings may expose the alternating layers of the layer stack. For example, the second openings may be openings through which a conductive gate material may be deposited at a later step (e.g., step 716), and also may be used to remove selected sacrificial layers of the layer stack and/or deposit and remove additional fill materials.

At step 710, the first spin-on material may be removed from the layer stack. For example, the first spin-on material may be removed from the layer stack by exposing the layers of the first spin-on material to a first etch chemistry. The first spin-on material may correspond to layers 208a, 308a, or 408b of structures 202, 302, or 402, respectively, or to similar layers that would have been present at initial stages of forming structures 502 or 602. The first spin-on material may be removed using any suitable etch process, including, for example, a wet etch process or a plasma process. At step 712, the first spin-on material may be replaced with a fourth material. The fourth material may correspond to the material of layers 208c, 308c, 408c, 508c, or 608c of structures 202, 302, 402, 502, or 602, respectively. In certain embodiments, the fourth material may be an insulating material, such as a nitride (e.g., SiN) or an oxide (e.g., $SiO_2$). The fourth material may be deposited using any suitable deposition technique, including, for example, an ALD or other CVD process.

At step 714, the second spin-on material may be removed from the layer stack. For example, the second spin-on material may be removed from the layer stack by exposing the layers of the second spin-on material to a second etch chemistry, which might or might not be the same as the etch chemistry used at step 710. The second spin-on material may correspond to layers 208b, 308b, or 408a of structures 202, 302, or 402, respectively, or to similar layers that would have been present at initial stages of forming structures 502 or 602. The second spin-on material may be removed using any suitable etch process, including, for example, a wet etch process or a plasma process. At step 716, the second spin-on material may be replaced with a fifth material. In certain embodiments, the fifth material may include a conductive material, such as a metal containing material or combination of materials suitable for use as a conductive gate/wordline (e.g., of a 3D memory device). The fifth material may be deposited using any suitable deposition technique, including, for example, an ALD or other CVD process.

In certain embodiments, replacing the second spin-on material with a fifth material includes replacing the second spin-on material (as removed at step 714) with a fill material (e.g., an oxide material), removing the fill material (using a suitable etch chemistry), and replacing the fill material with the fifth material. Examples of such a process are described with reference to processes 500 and 600. In certain embodiments, a portion of the fill material (e.g., in the second openings) may be removed (using a suitable etch chemistry) and replaced with yet another fill material (e.g., a metal oxide), and both the fill materials may be removed (using a suitable etch chemistry) and replaced with the fifth material. An example of such a process is described with reference to process 600.

As described above with reference to step 706, in certain embodiments, the third material may be a fill material to be later replaced by a channel material (e.g., between steps 712 and 714 or after step 716). For example, the fill material may be fill material 313, 413, 513, or 613 of structures 302, 402, 502, or 602, respectively. The third material may be, for example, a metal oxide material. The fill material may be replaced with a suitable channel material (including, potentially, a combination of materials, between steps 712 and 714 (e.g., as described with reference to processes 500 and 600) or after step 716 (e.g., as described above with reference to processes 300 and 400).

Figure 8A:
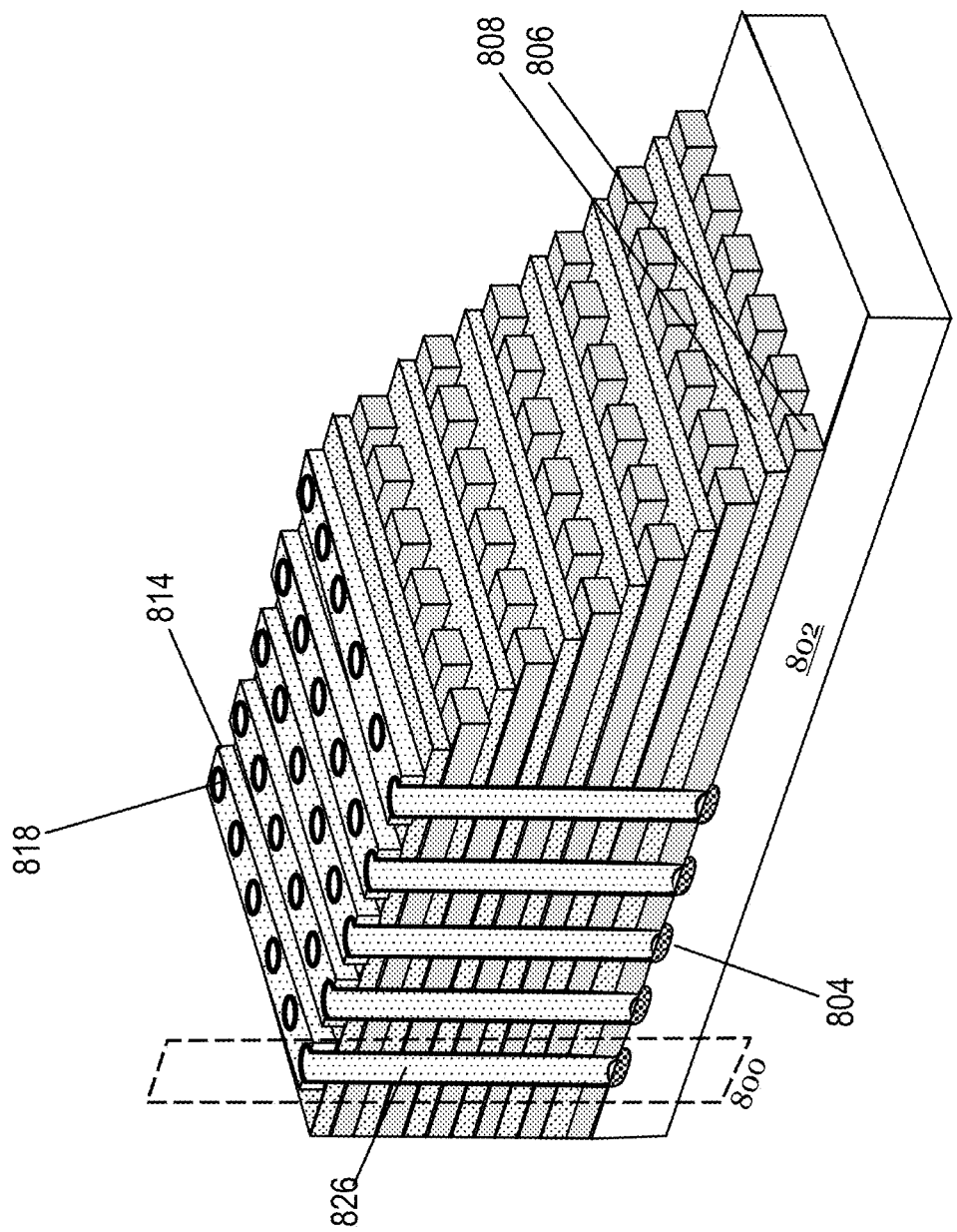
FIGS. 8A-8B illustrate example aspects of a 3D NAND memory array, according to certain embodiments of this disclosure.
Figure 8B:
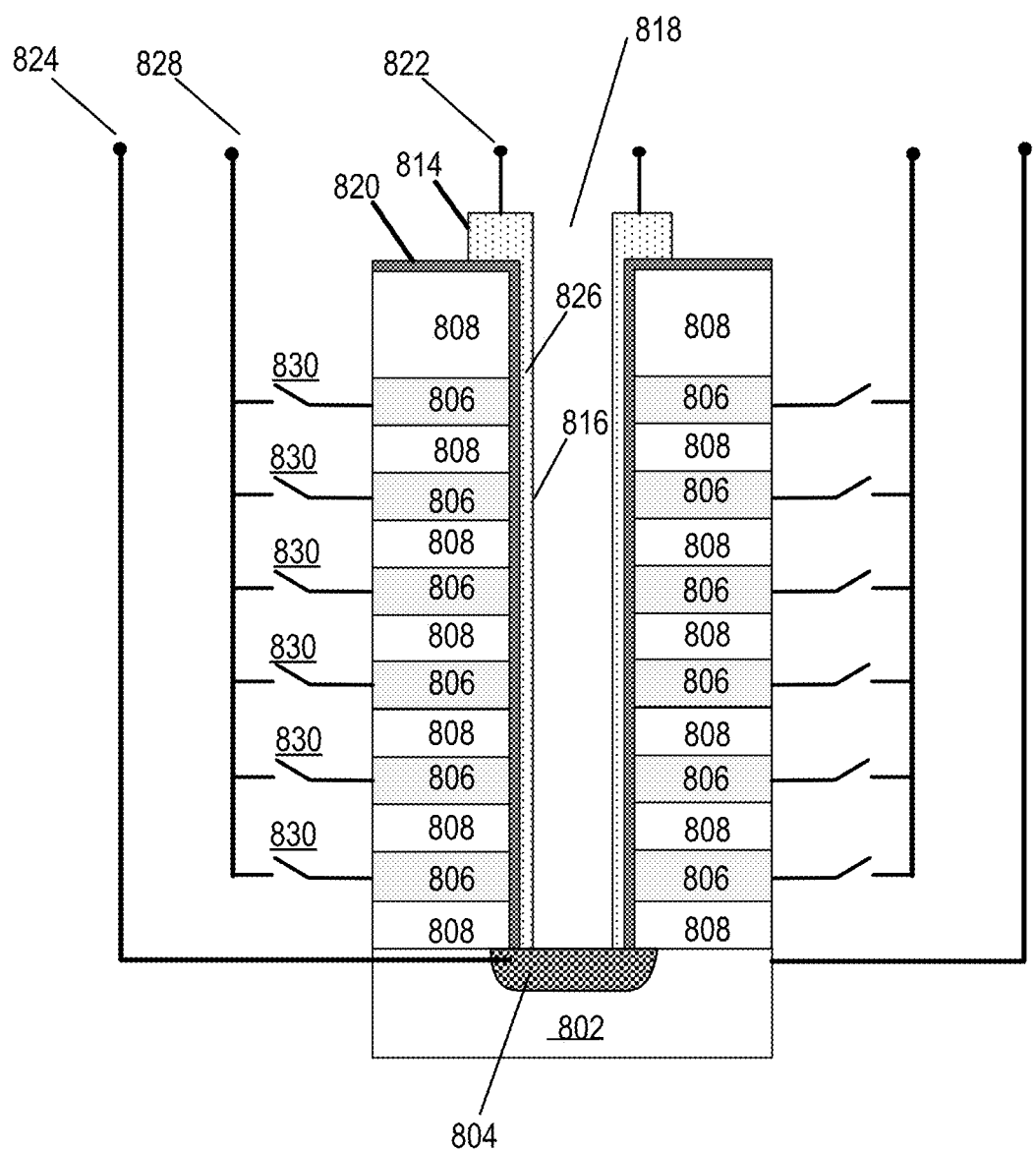

FIGS. 8A-8B illustrate example aspects of a 3D NAND memory array, according to certain embodiments of this disclosure. FIG. 8A illustrates a projection view of a cross-section through a 3D-NAND memory array formed in accordance with embodiments of this disclosure. FIG. 8B illustrates a cross-sectional view through a stack (e.g., which could be layer stack 206, 306, 406, 506, or 606 after processes 200, 300, 400, 500, or 600, respectively) of memory transistors in a 3D-NAND memory array formed in accordance with embodiments of this disclosure. In particular, FIG. 8B illustrates a cross sectional view of an example 3D NAND wordline stack (e.g., which could be layer stack 206, 306, 406, 506, or 606 after processes 200, 300, 400, 500, or 600, respectively) of alternating gates (wordlines) and insulating layers formed in accordance with embodiments of the invention.

FIG. 8A illustrates a semiconductor substrate 802 with a common drain bitline 804 formed therein. The cross section shows alternating layers of dielectric material 808 that electrically isolate layers of wordlines 806. Wordlines 806 are the alternating metal gates of stacked memory transistors in the 3D NAND array. In certain embodiments, dielectric material 808 corresponds to the remaining oxide or nitride material of the layer stacks formed from processes 200, 300, 400, 500, or 600 described above. Wordlines 806 may correspond to at least portions of materials 220, 320, 420, 520, or 620 in the layer stacks formed from processes 200, 300, 400, 500, or 600 described above.

Common source bitlines 814 (e.g., potentially including polysilicon), cross the top surface of the 3D NAND memory array perpendicular to the wordlines 806. The drain and source bitlines 804 and 814 are connected to thin transistor channels 816 (shown in FIG. 8B), made of silicon for example, on the sidewalls of channels 818, which may correspond to at least a portion of the channel materials that fill openings 212, 312, 412, 512, or 612 described above. The memory transistors in a layer of wordlines 806 share the common source bitlines 814 and common drain bitlines 804.

The cross sectional view illustrated in FIG. 8B through a stack of nonvolatile transistors in a 3D NAND memory array is depicted by the dashed box 800 in FIG. 8A.

Each transistor includes a gate (wordline 806) that is isolated from the transistor channel 816 by gate dielectric 820. Gate dielectric 820 may correspond to a portion of the channel materials described above. During programming, electrons can be trapped in gate dielectric 820. The trapped electrons raise the turn ON voltage of the nonvolatile transistor. Transistors with electrons trapped in gate dielectric 820 store logic state "1" whereas transistors without trapped electrons store logic state "o". These logic states are retained for 10 years or more even when the 3D NAND memory is not connected to a power supply. In certain embodiments, the transistors may be SONOS transistors. In other embodiments, the transistors may be TANOS transistors. Other types of transistors also are contemplated.

Multiple transistors are stacked one on top of another in the word line stack. The metal gate (wordline 806) of one transistor is isolated from other nonvolatile transistors stacked above and below by layers of dielectric material 808. The transistors of the stack share a common source terminal 822 and also share a common drain terminal 824. A thin layer of lightly doped silicon layer 826, e.g., doped between $10^{14}$ cm$^{-3}$ to $10^{17}$ cm$^{-3}$, forms the channels 816 for the stacked transistors in the 3D NAND memory array. The thin layer of lightly doped silicon layer 826 may be in-situ doped with an n-type dopant to form an n-channel transistor. One end of the thin layer of lightly doped silicon layer 826 is shorted to common source bitline 814 that is while the opposite end of the thin layer of lightly doped silicon layer 826 is shorted to common drain bitline 804.

During operation a voltage can be applied to common drain bitline 804 (drain terminal 824) with common source bitline 814 (source terminal 822) held at ground. Voltage on a gate terminal 828 can be connected to one of the gates (wordline 806) by turning one of gate select transistors 830 ON. If the transistor is programmed with a zero (no trapped electrons), channel 816 will turn ON and additional current flows through the channel 816 of the transistor. If, however, the transistor is programmed with a one (trapped electrons), channel 816 will remain OFF and no additional current flows.

Embodiments of this disclosure may provide some, none, or all of the following technical advantages. Furthermore, these and other technical advantages may be readily apparent to one of ordinary skill in the art based on this description.

In certain embodiments, using spin-on layers and sacrificial layers to in initially build a layer stack of alternating layers for a 3D semiconductor structure reduces stress on the semiconductor structure during formation of a layer stack. This reduction in stress may reduce or eliminate defects, such as bowing (so-called wafer bowing) or other defects, in the semiconductor structure. For example, the stress on the semiconductor structure may be measured using calipers or other tools to measure wafer bowing. In certain embodiments, relative to repeatedly performing a CVD deposition process to deposit each layer of a layer stack, depositing the layers of the layer stack as sacrificial layers using spin-on processing techniques and then replacing the sacrificial layers with the desired layers for the layer stack may reduce stress by half, by two-thirds, or more in the resulting semiconductor structure.

In certain embodiments, relative to repeatedly performing a CVD deposition process to deposit each layer of a layer stack, depositing the layers of the layer stack as sacrificial layers using spin-on processing techniques and then replacing the sacrificial layers with the desired layers for the layer stack may reduce costs, both in terms of processing time and expense. For example, repeatedly performing a CVD deposition process to deposit each layer of a layer stack may be both time consuming and expensive. In contrast, spin-on coating techniques are relatively fast and inexpensive. Furthermore, these sacrificial layers of the layer stack (the layers deposited by spin-coating), may be removed and replaced with the desired materials for the layer stack using potentially as few as one deposition step (per layer type of the layer stack), such as using an ALD or other CVD process.

Embodiments of this disclosure may be used to fabricate 3D semiconductor structures, such as 3D VNAND structures; however, 3D memory structures are just one example of 3D semiconductor structures that can take advantage of the techniques described herein. The techniques described herein can be used with other structures, including other 3D structures in addition to 3D memory cell structures that may include layer stacks.

It should be understood that the particular materials, etch processes, and deposition processes described herein are provided as examples only. The particular spin-on materials and combinations of spin-on materials used for the layer stacks described herein are provided as examples only. Additionally, the particular content of the final layer stack (with the sacrificial spun-on materials replaced with the target content of the layer stacks) described herein are provided as examples only. Additionally, the particular fill materials used as intermediate sacrificial materials (e.g., as fill materials for channel openings or within open areas of the layer stack at intermediate stages) described herein are provided as examples only. The particular materials, deposition processes (and associated process conditions), and etch processes (and associated process conditions) may be determined based on process integration goals, etch selectivity, the desired content of the layer stack (and possibly the channel holes, where applicable) in the semiconductor structure being formed, and other factors.

One or more deposition processes can be used to form the material layers described herein. For example, one or more depositions can be implemented using spin-coating, CVD, PECVD, PVD, ALD, and/or other deposition processes. The type of deposition process used, the chosen chemicals/gases used for that deposition process, and the process conditions used for that deposition process may be chosen to achieve a desired deposition material and rate for the materials being deposited, or according to other applicable factors.

Similarly, the etch processes can be implemented using wet etch processes, plasma etch processes, discharge etch processes, and/or other desired etch processes. The type of etch process used, the chosen chemicals/gases used for that etch process, and the process conditions used for that etch process may be chosen to achieve a desired etch rate and selectivity for the material(s) being etched relative to materials not being etched, or according to other applicable factors.

Reference throughout this specification to "one embodiment," "an embodiment," "certain embodiments," or the like means that a particular feature, structure, material, or characteristic described in connection with the embodiment is included in at least one embodiment of this disclosure, but do not denote that they are present in every embodiment. Thus, the appearances of the phrases "in one embodiment," "in an embodiment," "in certain embodiments," or the like in various places throughout this specification are not necessarily referring to the same embodiment of this disclosure. Furthermore, the particular features, structures, materials, or characteristics may be combined in any suitable manner in one or more embodiments. Various additional layers and/or structures may be included and/or described features may be omitted in other embodiments. It should be understood that references to "first," "second," "third," and the like in the specification do not necessarily correspond to uses of such terms in the claims, as uses in the claims may depend on the order of introduction.

"Substrate," "target substrate," "structure," or "device" as used herein generically refers to an object being processed in accordance with the invention, and may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate, structure, or device is not limited to any particular base structure, underlying layer or overlying layer, patterned or un-patterned, but rather, is contemplated to include any such layer or base structure, and any combination of layers and/or base structures. The description may reference particular types of substrates, structures, or devices, but this is for illustrative purposes only.

Systems and methods for fabricating a semiconductor structure are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of this disclosure. Similarly, for purposes of explanation, specific numbers, materials, and configurations are set forth in order to provide a thorough understanding of this disclosure. Nevertheless, this disclosure may be practiced without specific details. Furthermore, it is understood that the various embodiments shown in the figures are illustrative representations and are not necessarily drawn to scale.

Although this disclosure describes particular process/method steps as occurring in a particular order, this disclosure contemplates the process steps occurring in any suitable order. Further modifications and alternative embodiments of the described systems and methods will be apparent to those skilled in the art in view of this description. It will be recognized, therefore, that the described systems and methods are not limited by these example arrangements. Thus, although aspects of this disclosure are described with reference to specific embodiments, various modifications and changes can be made without departing from the scope of this disclosure. Accordingly, the specification and figures are to be regarded in an illustrative rather than a restrictive sense, and such modifications are intended to be included within the scope of this disclosure. Further, any benefits, advantages, or solutions to problems that are described herein with regard to specific embodiments are not intended to be construed as a critical, required, or essential feature or element of any or all the claims.

What is claimed is:

1. A method of fabricating a device, the method comprising:
    forming, on a substrate, a layer stack of alternating layers of a first spin-on material and a second spin-on material, each layer of the first spin-on material and the second spin-on material formed by spin-on deposition;
    etching first openings through the layer stack;
    filling the first openings with a third material;
    etching second openings through the layer stack;
    removing the first spin-on material from the layer stack;
    replacing the first spin-on material with a fourth material, the fourth material being a metal-containing material;
    removing the second spin-on material from the layer stack; and
    replacing the second spin-on material with a fifth material, the fifth material being an insulating material.

2. The method of claim 1, further comprising:
    removing the third material from the first openings; and
    replacing, prior to replacing the first spin-on material with the fourth material, the third material with a sixth material.

3. The method of claim 1, further comprising:
    removing the third material from the first openings; and
    replacing, after replacing the first spin-on material with the fourth material, the third material with a sixth material.

4. The method of claim 1, wherein the third material comprises one or more of silicon dioxide, silicon nitride, and polysilicon.

5. The method of claim 1, wherein:
the first spin-on material comprises spin-on-glass (SOG), spin-on-carbon (SOC), silicon oxycarbide (SiOC), organic dielectric layer (ODL), organic planarization layer (OPL), spin-on hardmask (SOH), metal oxide, silicon oxynitride (SiON), silicon oxycarbonitride (SiOCN), silicon nitride (SiN), silicon, silicon carbide (SiC), photoresist, bottom anti-reflective coating (BARC), developable BARC (DBARC), or photosensitive film material; and
the second spin-on material comprises SOG, SOC, SiOC, ODL, OPL, SOH, metal oxide, SiON, SiOCN, SIN, SiC, photoresist, BARC, DBARC, or photosensitive film material.

6. A method, comprising:
forming, on a substrate, a layer stack comprising alternating layers of a first spin-on material and a second spin-on material, each layer of the first spin-on material of the layer stack and the second spin-on material of the layer stack formed by spin-on deposition;
etching first openings through the layer stack;
filling the first openings with a first fill material;
etching second openings through the layer stack;
removing the first spin-on material from the layer stack;
replacing the first spin-on material with a fourth material, the fourth material being an oxide or a nitride;
removing the fill material from the first openings;
replacing the fill material with a fifth material;
removing the second spin-on material from the layer stack; and
replacing the second spin-on material with a sixth material.

7. The method of claim 6, wherein:
the first spin-on material comprises spin-on glass; and
the fourth material comprises an oxide.

8. The method of claim 6, wherein:
the first spin-on material comprises spin-on carbon; and
the fourth material comprises a nitride.

9. The method of claim 6, wherein the first fill material comprises a metal oxide material.

10. The method of claim 6, wherein:
the sixth material comprises a metal-containing material; and
removing the fill material from the first openings and replacing the fill material with the fifth material is performed after removing the second spin-on material from the layer stack and replacing the second spin-on material with the sixth material.

11. The method of claim 6, wherein:
the sixth material comprises a second fill material; and
removing the fill material from the first openings and replacing the fill material with the fifth material is performed prior to removing the second spin-on material from the layer stack and replacing the second spin-on material with the sixth material.

12. The method of claim 11, wherein the second fill material comprises:
a nitride material; or
a metal oxide material.

13. The method of claim 11, further comprising removing the sixth material and replacing the sixth material with a metal-containing material.

14. The method of claim 6, wherein the fifth material comprises one or more of silicon dioxide, silicon nitride, and polysilicon.

15. The method of claim 6, wherein the fourth material is deposited using an atomic layer deposition process.

16. The method of claim 6, wherein:
removing the first spin-on material from the layer stack comprises removing the first spin-on material using a wet etching process; and
removing the second spin-on material from the layer stack comprises removing the second spin-on material using a wet etching process.

17. A method for fabricating a three-dimensional (3D) NAND device, comprising:
forming, on a substrate, a layer stack of alternating layers of a first spin-on material and a second spin-on material, each layer of the first spin-on material and the second spin-on material formed by spin-on deposition;
etching channel holes through the layer stack;
filling the channel holes with a third material;
etching slits through the layer stack, the slits exposing the alternating layers of the layer stack;
removing the first spin-on material from the layer stack by exposing the layers of the first spin-on material to a first etch chemistry;
replacing the first spin-on material with a fourth material, the fourth material being an insulating material, the insulating material comprising an oxide or a nitride;
removing the second spin-on material from the layer stack by exposing the layers of the second spin-on material to a second etch chemistry; and
replacing the second spin-on material with a fifth material, the fifth material being a metal-containing material.

18. The method of claim 17, wherein replacing the second spin-on material with the fifth material comprises:
replacing the second spin-on material with a sixth material;
removing the sixth material from the layer stack by exposing the layers of the second spin-on material to a third etch chemistry; and
replacing the sixth material with the fifth material.

19. The method of claim 18, wherein:
the third material comprises a fill material; and
the method comprises, after replacing the second spin-on material with the sixth material and prior to removing the sixth material from the layer stack and replacing the sixth material with the fifth material, removing the third material from the channel holes and replacing the third material with a seventh material, the seventh material comprising one or more of silicon dioxide, silicon nitride, and polysilicon.

20. The method of claim 17, comprising filling the channel holes with the third material after replacing the second spin-on material with the fifth material.

* * * * *